United States Patent
Watanabe et al.

(10) Patent No.: US 8,564,951 B1
(45) Date of Patent: Oct. 22, 2013

(54) ELECTRONIC APPARATUS AND COOLING MODULE MOUNTED IN THAT ELECTRONIC APPARATUS

(71) Applicant: Fujitsu Limited, Kawasaki (JP)

(72) Inventors: Masayuki Watanabe, Yokohama (JP); Kenji Sasabe, Yokohama (JP); Eiji Wajima, Kawasaki (JP); Masumi Suzuki, Kawasaki (JP); Michimasa Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/673,282

(22) Filed: Nov. 9, 2012

(30) Foreign Application Priority Data

Sep. 7, 2012 (JP) ................................ 2012-197918

(51) Int. Cl.
*H05K 7/20* (2006.01)
(52) U.S. Cl.
USPC .............. 361/695; 361/679.47; 361/679.53; 361/696; 361/699; 361/700; 165/80.2; 165/80.3; 165/80.4; 165/104.33; 165/121; 165/185
(58) Field of Classification Search
USPC ................. 361/679.46–679.54, 688, 689, 361/690–699, 715–727; 165/80.2–80.5, 165/104.14, 104.26, 104.33, 104.34, 165/121–126, 185; 62/259.2; 454/184
See application file for complete search history.

(56) References Cited

U.S. PATENT DOCUMENTS

| | | | |
|---|---|---|---|
| 6,587,343 B2 * | 7/2003 | Novotny et al. ............. | 361/698 |
| 6,862,185 B2 * | 3/2005 | Morris ......................... | 361/721 |
| 6,997,247 B2 * | 2/2006 | Malone et al. ............... | 165/150 |
| 7,002,799 B2 * | 2/2006 | Malone et al. ............... | 361/699 |
| 7,068,509 B2 * | 6/2006 | Bash et al. ................... | 361/700 |
| 7,203,063 B2 * | 4/2007 | Bash et al. ................... | 361/699 |
| 7,252,139 B2 * | 8/2007 | Novotny et al. ............ | 165/80.2 |
| 7,280,358 B2 * | 10/2007 | Malone et al. ............... | 361/701 |
| 7,457,116 B2 * | 11/2008 | Erturk et al. ................. | 361/696 |
| 7,477,516 B2 * | 1/2009 | Joshi et al. ................... | 361/702 |
| 7,551,440 B2 * | 6/2009 | Belady et al. ................ | 361/699 |
| 7,667,967 B1 * | 2/2010 | Copeland et al. ............ | 361/696 |
| 7,957,132 B2 * | 6/2011 | Fried ........................ | 361/679.47 |
| 8,051,897 B2 * | 11/2011 | Campbell et al. ........... | 165/80.4 |
| 8,077,463 B2 * | 12/2011 | Lee .............................. | 361/700 |
| 8,385,069 B2 * | 2/2013 | Iyengar et al. ............... | 361/700 |
| 2007/0125523 A1 * | 6/2007 | Bhatti et al. .............. | 165/104.33 |
| 2010/0300652 A1 * | 12/2010 | Lee .............................. | 165/80.4 |
| 2011/0272128 A1 | 11/2011 | Suzuki et al. | |

FOREIGN PATENT DOCUMENTS

JP 2005-038112 A 2/2005

* cited by examiner

*Primary Examiner* — Michail V Datskovskiy
(74) *Attorney, Agent, or Firm* — Squire Sanders (US) LLP

(57) ABSTRACT

An electronic apparatus includes a fan, a circuit board which is positioned downstream in an airflow to which the fan generates, at least one processer mounted on the circuit board, a radiator which is positioned downstream in the airflow which the fan generates, the radiator cooling a liquid coolant, a pipe unit which includes a heat receiving member in which the coolant flows and coolant piping, the heat receiving member being mounted on the processer, and the coolant piping circulating the liquid coolant between the radiator and the heat receiving member, and at least one memory board on which memory package is mounted, the memory board being mounted on the circuit board, and the memory board and the pipe unit being arranged along a direction perpendicular to a direction to which the fan blows the airflow.

10 Claims, 20 Drawing Sheets

FLOW OF COOLING AIR

ELECTRONIC APPARATUS AND COOLING MODULE MOUNTED IN THAT ELECTRONIC APPARATUS

CROSS-REFERENCE TO RELATED APPLICATION

This application claims priority from, and incorporates by reference the entire disclosure of, Japanese Patent Application No. 2012-197918, filed on Sep. 7, 2012.

FIELD

The present application relates to an electronic apparatus which is able to cool high heat generating components, which are arranged aligned, with a high efficiency and to a cooling module which is mounted in that electronic apparatus.

BACKGROUND

In recent years, servers and other electronic apparatuses have been made higher in speed and more advanced in functions. Such electronic apparatuses mount large numbers of electronic devices. These electronic devices generate heat along with their operation. One of these electronic devices, the CPU (central processing unit), is now consuming increased power due to its higher speed and more advanced functions. The amount of heat generated by a CPU tends to increase the greater the supplied power. Further, in general, a server mounts a plurality of CPUs. The amount of heat which is generated from these becomes tremendous. If the heat causes the inside of the server to become high in temperature, the functions of the electronic devices will become impaired and malfunction of the server will be caused. Therefore, to maintain the functions of the electronic devices and avoid malfunction of the server, the heat generating electronic devices need to be cooled.

As a radiator which takes heat from heat generating electronic devices and discharges it to the outside, there is known a liquid cooling system which runs coolant through coolant piping and uses its passage so as to take heat from the electronic devices and discharges the heat to the outside (for example, Japanese Laid-Open Patent Publication No. 5-109798 and Japanese Laid-Open Patent Publication No. 2005-381126). A liquid cooling system in general is provided with heat receiving units, a radiator, pumps, a manifold, and a plurality of pipes which connect these with each other to form a closed path. The heat receiving unit takes heat from the CPUs using the coolant, while the radiator discharges the heat of the coolant which has become high in temperature due to the taken heat to the air or other outside part. The coolant which flows through the channels which are formed by the piping is supplied with the force for running through the channels by the pumps. The manifold divides and merges the coolant which flows through the channels.

In this regard, since a liquid cooling system has such a plurality of components, when applying the liquid cooling system to a server, since there is a limit to the space inside of the server, the layout of the components inside the server has to be considered or else mounting is not possible. Further, in a server, an air cooling system which uses fans is mounted for cooling the electronic components other than the CPUs. The fans are used to take in outside air as the cooling air so as to cool the electronic components and to discharge to the outside the cooling air which has become high in temperature due to the taken heat. For this reason, if mounting a liquid cooling system in addition to the existing air cooling system, there is the problem that the flow of the cooling air which is supplied by the air cooling system will be blocked by the components of the liquid cooling system and cooling will be obstructed. Mounting has therefore been difficult.

Furthermore, a server or other electronic apparatus is installed in a data center or computer room or other cramped location, so the places where it can be installed are limited. To enable a large number of servers to be installed in such limited locations, reduction of the server size and reduction of the area occupied at the time of installation are sought. In this regard, in recent years, servers have been expanded in functions and performance, so the work, calculations, etc. which used to be performed by a large number of servers can now be performed by a smaller number of servers. Also, individual servers have also been improved in performance, so the area which the hardware occupies has been reduced. This improvement of the functions which the servers can perform and improvement of the performance of the servers have led to higher density mounting of electronic components in the servers. When mounting electronic components in servers at such a higher density, the issue arises of how to efficiently cool the heat generating electronic components.

SUMMARY

The present application provides an electronic apparatus includes a fan, a circuit board which is positioned downstream in an airflow to which the fan generates, at least one processer mounted on the circuit board, a radiator which is positioned downstream in the airflow which the fan generates, the radiator cooling a liquid coolant, a pipe unit which includes a heat receiving member in which the coolant flows and coolant piping, the heat receiving member being mounted on the processer, and the coolant piping circulating the liquid coolant between the radiator and the heat receiving member, and at least one memory board on which memory package is mounted, the memory board being mounted on the circuit board, and the memory board and the pipe unit being arranged along a direction perpendicular to a direction to which the fan blows the airflow.

DESCRIPTION OF EMBODIMENTS

Figure 1A:
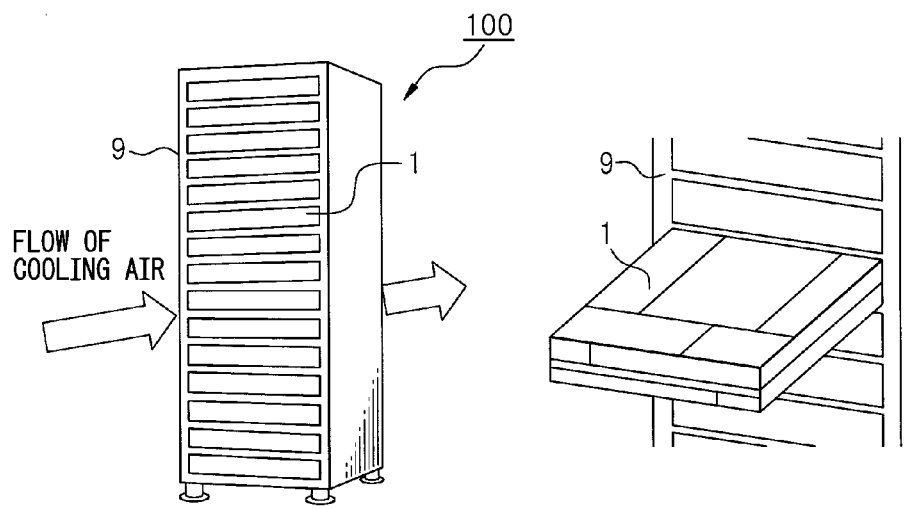
FIG. 1A is a perspective view which illustrates the appearance of a server which mounts a plurality of server modules which are provided with cooling modules according to the present application.

Below, the attached drawings will be used to explain modes of working the present application in detail based on specific embodiments. Note that in the embodiments which are explained below, as the electronic apparatus, a server module which forms a server is explained as an example, but the electronic apparatus is not limited to this. Further, in the following embodiments, component members which are provided with the same functions will be assigned the same reference numerals for the explanations.

FIG. 1A is a perspective view which illustrates the appearance of a rack mount server 100 in which a server module 1 which is provided with a liquid cooling system according to the present application is mounted in a rack cabinet 9. The rack mount server 100 is one type of data processing system. Inside the rack cabinet 9, one or more server modules 1 are mounted. The cooling air for cooling the server module 1 is sucked in from the front surface, cools the internal devices of the server module 1, and is exhausted from the rear surface.

Figure 1B:
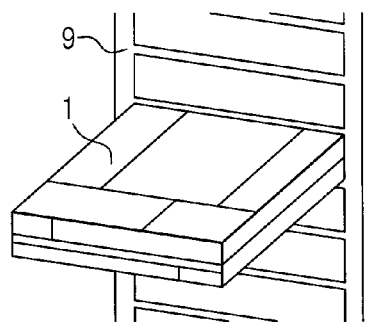
FIG. 1B is a partially enlarged view which illustrates a state of pulling out one server module from a rack cabinet of the server which is illustrated in FIG. 1A.
Figure 1C:
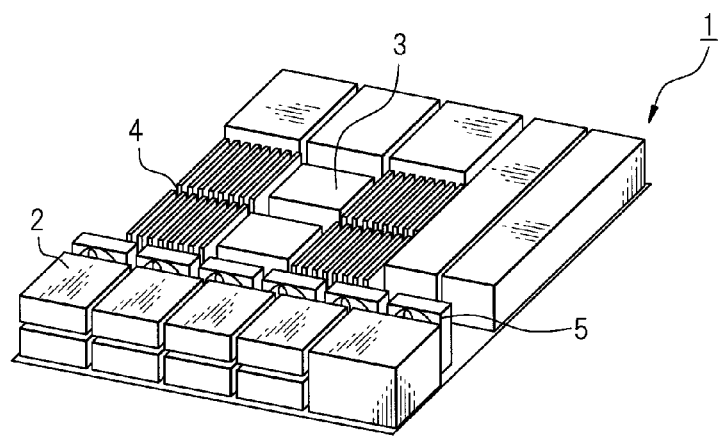
FIG. 1C is a perspective view which illustrates a general internal configuration of one server module which mounts an air cooling system.

FIG. 1B is a partially enlarged view which illustrates the state when pulling out one server module 1 from the rack cabinet 9 which is illustrated in FIG. 1A. Further, FIG. 1C is a perspective view which illustrates the configuration of the air cooling system which is mounted in one server module 1. Inside the server module 1, the first heat generating components 2 are at the upstream side of the fans 5 with respect to the flow of the cooling air, while at the downstream side of the fans 5, CPUs (second heat generating components) 3, electronic components 4, etc. are arranged. The first heat generating components 2 are, for example, hard disks or SSDs (solid state devices) or other electronic components. The cooling air from the fans 5 is used to cool the CPUs 3 and electronic components 4 and other heat generating components and electronic components.

Figure 2A:
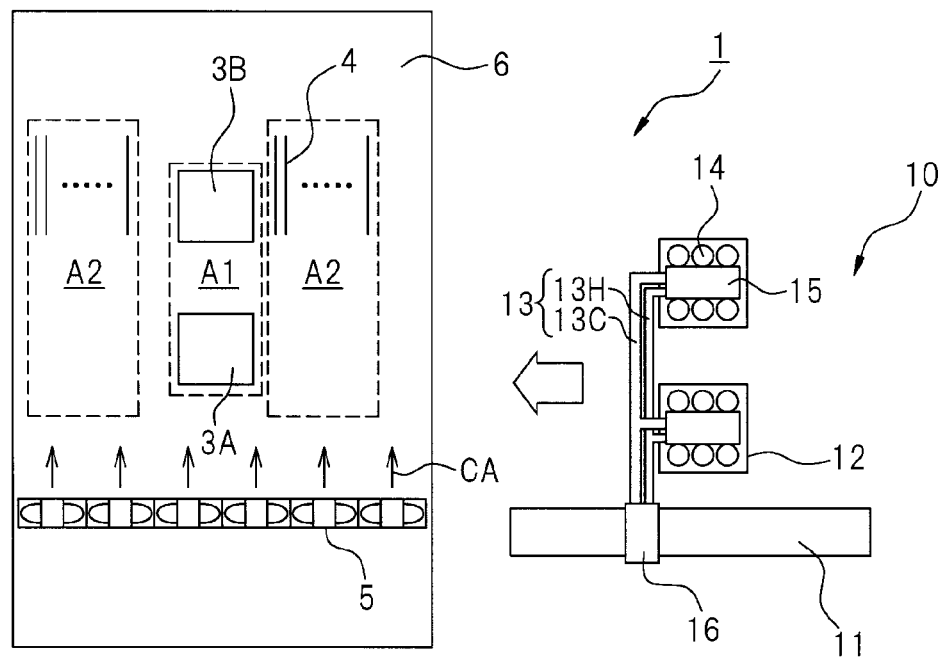
FIG. 2A is an assembled view which illustrates a state of mounting a liquid cooling module according to the present application in a server module of a first embodiment of the present application which is provided with an air cooling system.
Figure 2B:
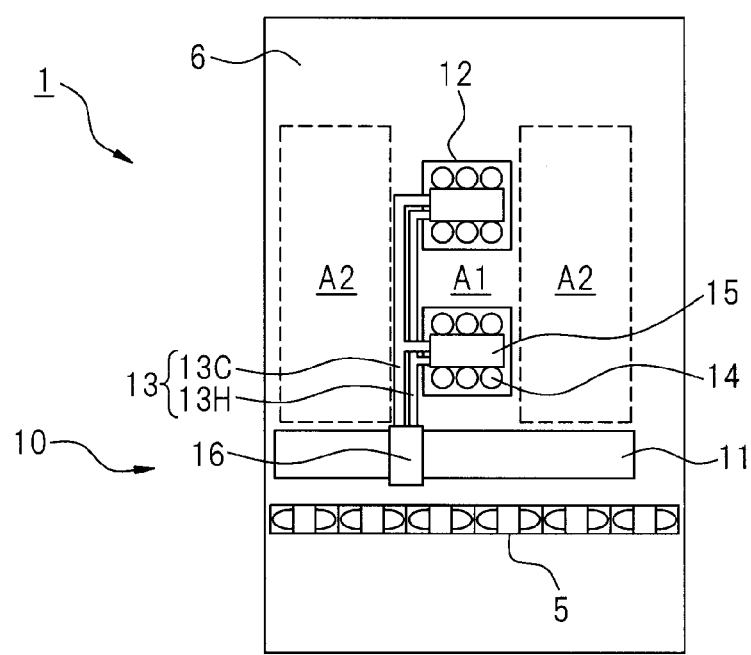
FIG. 2B is a plan view which illustrates a state of a cooling module mounted in a server module which is provided with an air cooling system which is illustrated in FIG. 2A.

FIG. 2A illustrates the server module 1 of one embodiment of the present application and is an assembled view which illustrates by a plan view the state of the server module 1 which is provided with an air cooling system and mounts the liquid cooling system 10. Note that, after this, the liquid cooling system 10 will sometimes also be referred to as the "cooling module 10". Further, FIG. 2B is a plan view which illustrates the state of the server module 1 which is provided with an air cooling system which is illustrated in FIG. 2A and mounts the liquid cooling system 10. The air cooling system is provided with a plurality of fans 5 which generate cooling air. The main board 6 at the upstream side of the fans 5 is provided with the first heat generating components (hard disk, SSD, etc.) which were explained in FIG. 1C, but here their illustration is omitted.

In the present application, the region on the main board 6 at the downstream side from the fans 5 of the server module 1 is divided by lines which run in the direction of flow of the cooling air CA into a first region A1 and second regions A2. The first region A1 is a region in which a plurality of heat generating components (here, the heat generating components 3A and 3B) are arranged. The plurality of heat generating components 3A and 3B are arranged aligned along the direction of flow of the cooling air CA. The heat generating components 3A and 3B are, for example, the CPUs 3A and 3B. These are large heat generating components which require strong cooling. In this embodiment, the CPU 3B is arranged at the downstream side of the CPU 3A. Accordingly, the heat generating components 3A and 3B are subsequently also referred to as the "CPUs 3A and 3B" or "the components which require strong cooling 3A and 3B". The second regions A2 are regions which are positioned at the two sides of the first region A1 (sometimes at one side of the first region A1) and contain electronic components which can be cooled by cooling air.

The CPUs 3A and 3B which are arranged at the first region A1 may not be cooled sufficiently by cooling air, that is, are components which require strong cooling, so are cooled by the liquid cooling system 10. The part at which the liquid cooling system 10 is arranged also has components which do not require cooling air, that is, have 1W or less heat generating characteristics. If the CPUs 3A and 3B are arranged in the region at which the liquid cooling system 10 is arranged, the direction of flow of the cooling air need not be straight. The electronic components 4 which are arranged at the second regions A2 are electronic components 4 which can be cooled by the supply of cooling air or which can be cooled by the supply of cooling air and the attachment of a heat sink or other radiator and which have 1W to 100W or so heat generating characteristics. They are also called "components which require weak cooling". As such electronic components 4, there are DIMMs (memory modules), power components, etc.

The above-mentioned first region A1 and second regions A2 are elongated rectangular regions. Non-tapering regions are secured. This is because if the regions on the main board 6 are finely divided by the components etc. of the liquid cooling system 10, the distance between air cooled components will be limited by the liquid cooling system 10 and realization of the circuit configuration which the system requires will become difficult. The position of the first region A1 on the main board 6 is determined by the sizes and positions of the second regions A2, but in general is a position slightly offset from the center part of the main board 6. Further, the second regions A2 which are positioned at the two sides of the first region A1 may not be the same.

In the present application, the region on the main board 6 at the downstream side of the cooling air CA of the air cooling system is divided into the first region A1 and the second regions A2. In this server module 1, a liquid cooling system 10 designed not to interfere with the cooling air CA to the second regions A2 is mounted at the first region A1. The liquid cooling system 10 is in general provided with a radiator which cools the coolant, heat receiving members which take heat from the heat generating components (absorb heat from them), coolant piping which runs coolant from the radiator to the heat receiving members, and pumps which make the coolant in the coolant piping move. The heat receiving members are also called "cooling jackets".

In the embodiment which is illustrated in FIGS. 2A and 2B, the radiator 11 is provided at the downstream side of the fans 5 so that it is sufficiently cooled by the cooling air CA. Usually, it is provided in the direction vertical to the direction of flow of the cooling air CA. It is arranged so that all of the cooling air CA which is supplied by the fans 5 can be supplied to it. The length of the radiator 11 is shorter than the total length of the plurality of aligned fans 5. The heat receiving members 12 are provided on the CPUs 3. The coolant piping 13 which supplies coolant to the heat receiving members 12 from the radiator 11 is provided on the main board 6 so as not to enter the second regions A2. The radiator 11 has a plurality of channels. The coolant piping 13 is connected by the manifold 16 to the plurality of channels of the radiator 11. Further, between the coolant piping 13 and the heat receiving member 12, tanks 15 which temporarily store the coolant and pumps 15 which move the coolant are provided. The configuration of the pumps 14 will be explained in detail later, but pluralities are provided at the two sides of the tanks 15. Note that, if the pumps 14 are large in capacity, the pumps 14 may also be provided at just single sides of the tanks 15.

Due to this structure, the heat receiving members 12 has the pumps 14 and the tanks 15 arranged concentrated on them in adjoining manners, so the coolant piping 13 which connects these can be shortened and space can be saved. Further, the channel resistance when the coolant flows through the inside of coolant piping 13 depends on the length of the coolant piping 13, so by making the coolant piping 13 shorter, the channel resistance of the coolant which flows through the inside of the liquid cooling system 10 can be made smaller. Further, by the amount of movement of the coolant becoming greater, heat is efficiently transferred from the heat receiving units 12 to the radiator 11, so the liquid cooling system 10 can be improved in performance.

Furthermore, the components which require strong cooling are concentrated at the first region A1 while avoiding the second regions, so the components of the liquid cooling system 10 can also be concentrated at the first region A1. As a result, the second regions A2 can be secured wide without being made narrow. On top of this, the liquid cooling system 10 does not inhibit the flow of cooling air CA to the second regions A2 and can sufficiently supply cooling air CA to the electronic components 4 which are mounted at the second regions A2. Due to these advantages, the performance of the liquid cooling system 10 is improved and it becomes possible to mount at the server a liquid cooling system 10 which cools heat generating components 3A and 3B which have 300W or so high heat generating characteristics while not interfering with the cooling of electronic components 4 which use cooling air CA for cooling.

Figure 3A:
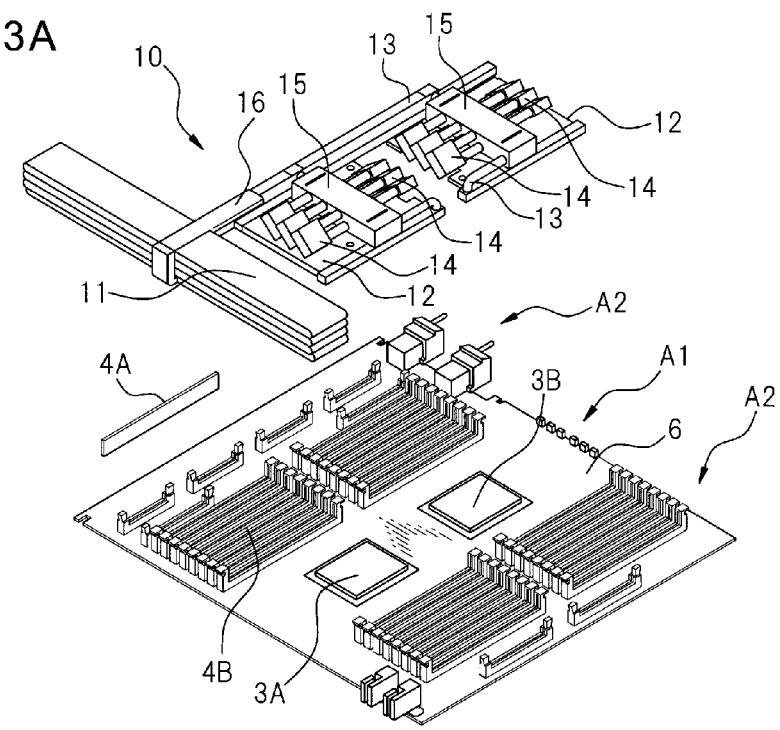
FIG. 3A is an assembled perspective view which illustrates a state of mounting the cooling module according to the present application at a main board in a server module which is provided with the cooling module which is illustrated in FIG. 2A.
Figure 3B:
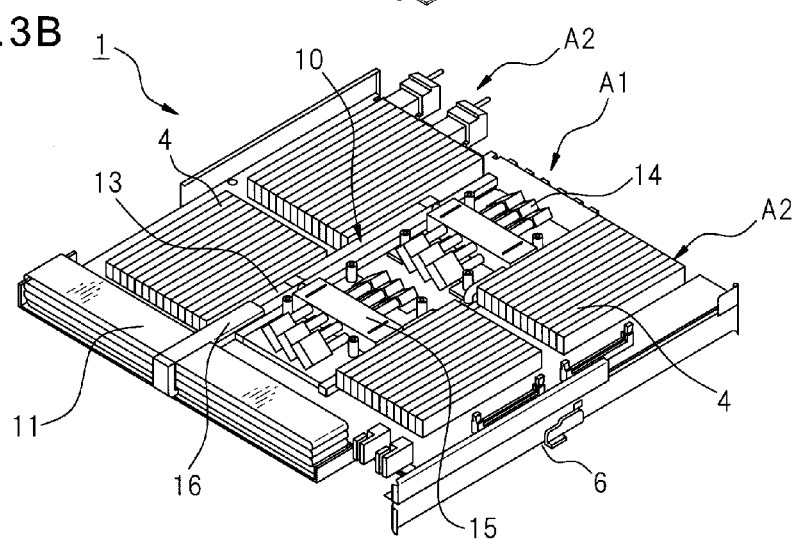
FIG. 3B is a perspective view of the server module which is illustrated in FIG. 2B.

FIG. 3A is an assembled perspective view which illustrates the state of mounting the liquid cooling system 10 on the main board 6 which is illustrated in FIG. 2A, while FIG. 3B is a perspective view of the server module 1 which is illustrated in FIG. 2B. As will be understood from these figures, the electronic components 4 include a large number of electronic components which are mounted on one or both surfaces of a sub board 4A. The sub board 4A is attached to a socket 4B which is provided on the main board 6. Further, a single tank 15 has six pumps 14 connected to it in parallel, so the flow rate of the coolant can be increased.

Figure 9:
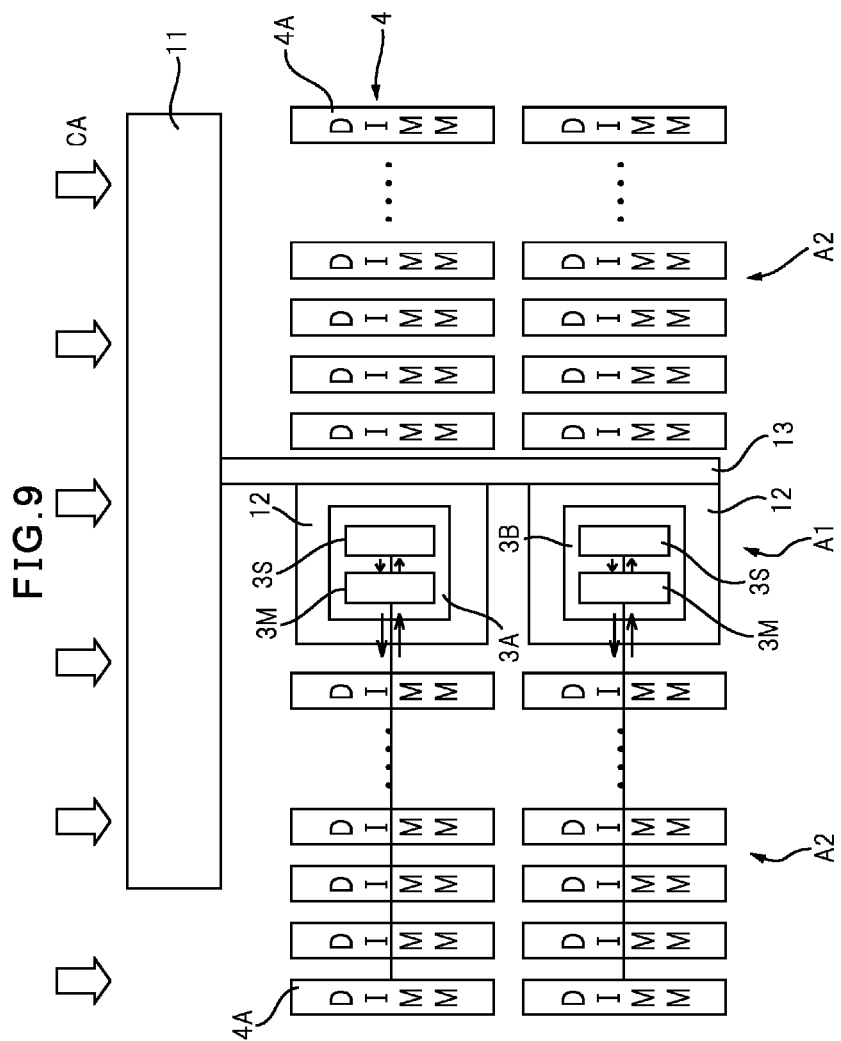
FIG. 9 is an explanatory view which illustrates the layout of heat generating components and memories in a server module according to the present application and the layout of a cooling module which cools the heat generating components.

Here, FIG. 9 will be used to explain the features of the layout of sub boards 4A on which the electronic components 4 are mounted and the connection with the CPUs 3A and 3B. Here, the electronic components 4 are memories (DIMM). The DIMMs 4 are structured as sub boards 4A on both or one side of which a plurality of DRAM devices are mounted. Below, the electronic components 4 will also be referred to as "memories 4" or "DIMMs 4". Pluralities of the sub boards 4A are arranged in parallel with the flow of the cooling air CA at the two sides of the CPUs 3A and 3B. For this reason, the physical wiring lengths between the DIMMs 4 and the CPUs 3A and 3B can be made the shortest.

Inside of the CPUs 3A and 3B, there are system controllers 3S and memory access controllers 3M. The memories 4 transfer data with the CPUs 3A and 3B through the memory access controllers 3M and the system controllers 3S. Data transfer between devices takes time corresponding to the length of wiring between the devices (physical distance). During that time, the data processing at the CPUs is stopped. In the present embodiment, as explained above, the physical length of wiring between the memories 4 and the CPUs 3A and 3B can be made the shortest, so the time until completion of transfer of data (memory latency) is small and the time required for data processing in the system as a whole can be shortened.

That is, in the present embodiment, the layout of the CPUs 3A and 3B and the memories 4 is given the greatest priority to in the design of the main board 6. The liquid cooling system 10 is arranged in accordance with the layout of the components which require strong cooling 3 on the main board 6. For this reason, in the present embodiment, the liquid cooling system 10 is arranged at a location offset from the center of the main board 6, while the air cooling system has a left-right asymmetric area ratio.

Figure 4:
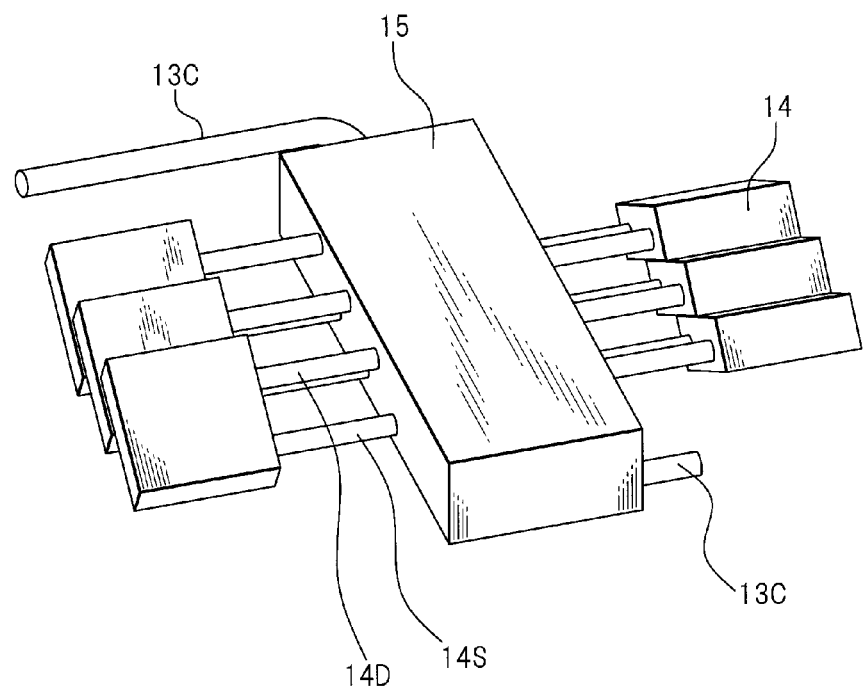
FIG. 4 is an enlarged perspective view of principal parts which illustrates a tank and pumps in the cooling module which is illustrated in FIG. 3A.

FIG. 4 is an enlarged perspective view which illustrates the principal parts of structures of the coolant piping 13, pumps 14, and a tank 15 in the liquid cooling system 10 which is illustrated in FIG. 3A. The coolant piping 13 is provided with a cold water pipe 13C through which low temperature coolant which was cooled at the radiator flows and a warm water pipe (not illustrated) through which high temperature coolant which had absorbed the heat of the heat generating components and risen in temperature flows. The cold water pipe 13C is connected to the tank 15. The tank 15 is provided with six pumps 14. The pumps 14 suck in coolant which was temporarily stored inside the tank 15 by the suction pipes 14S and return it through the discharge pipes 14D to the inside of the tank 15. The six pumps 14 are attached to the tank 15 in diagonally slanted states so as to lower the heights from the heat receiving members 12. The coolant which is returned from the six pumps 14 to the inside of the tank 15 merges, passes through the cold water pipe 13C, and is supplied to the not illustrated heat receiving members. The structure of the heat receiving members will be explained later. At the inside of the pump 14, while not illustrated, backflow of coolant at the time of pump breakdown is prevented.

Figure 5A:
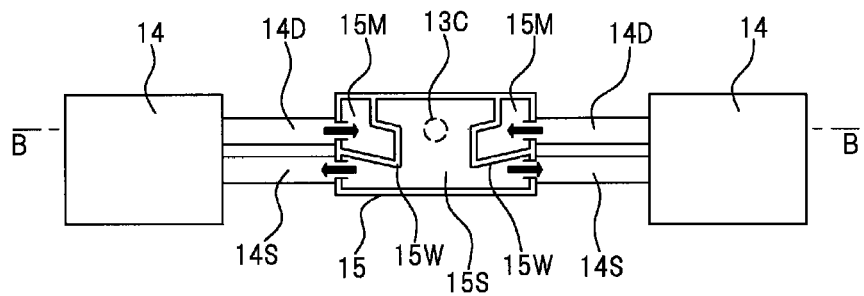
FIG. 5A is a vertical cross-sectional view which illustrates one example of the internal structure of the tank which is illustrated in FIG. 4.
Figure 5B:
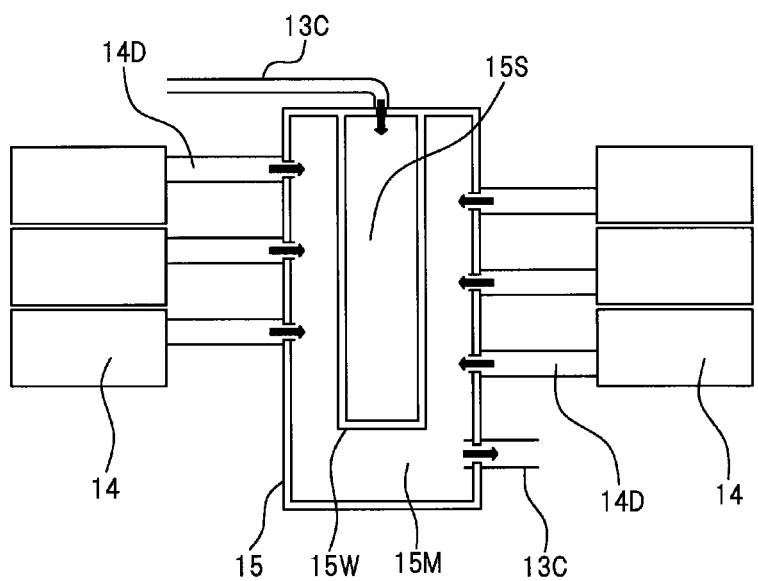
FIG. 5B is a cross-sectional view along the line B-B of FIG. 5A.

FIG. 5A is a vertical cross-sectional view which illustrates one example of the internal structure of a tank 15 which is illustrated in FIG. 4, while FIG. 5B is a cross-sectional view along the line B-B of FIG. 5A. As will be understood from these figures, the tank 15 is divided internally into two chambers by a partition wall 15W. One chamber is a storage chamber 15S to which the coolant piping 13 which is connected to the radiator and the suction pipes 14S of the pumps 14 are connected. The other chamber is a mixing chamber 15M to which the cooling piping 13 which is connected to the heat receiving members and the discharge pipes 14D of the pumps 14 are connected. The storage chamber 15S receives and temporarily stores the coolant which flows in from the radiator. At this time, the air which is contained in the coolant builds up at the ceiling part of the storage chamber 15S. The suction pipes 14S of the pumps 14 are connected to parts close to the bottom surface of the storage chamber 15S so as to suck out coolant, so air which has built up at the ceiling part of the storage chamber 15S will never enter the pumps 14. The mixing chamber 15M receives and mixes coolant from the pumps 14 flowing in through the discharge pipe 14D and discharges the mixture from the coolant piping 13. The partition wall 15W is not limited in shape to this embodiment.

Figure 6A:
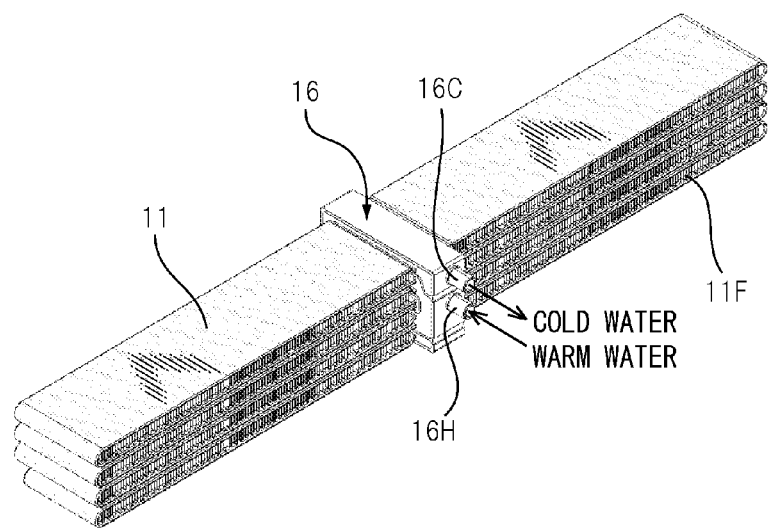
FIG. 6A is a perspective view which illustrates one embodiment of the structure of a connecting part of fins and coolant piping of a radiator which is illustrated in FIG. 3.
Figure 6B:
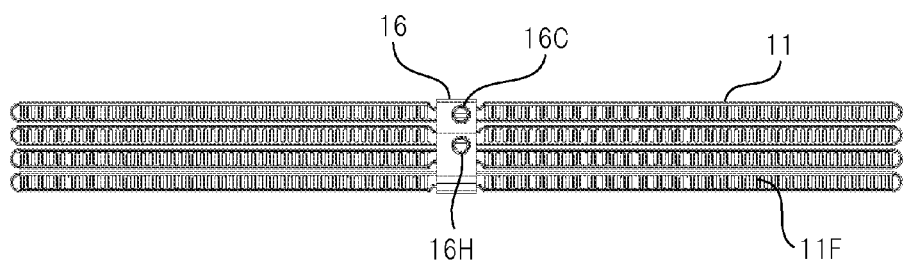
FIG. 6B is a front view of the radiator which is illustrated in FIG. 6A.

FIG. 6A is a perspective view which illustrates the configuration of one embodiment of the radiator 11 in the present application, while FIG. 6B is a front view of the radiator 11 which is illustrated in FIG. 6A. The radiator 11 of this embodiment is provided with four radiating channels at the left side and four radiating channels at the right side centered about a manifold 16. The channels are shaped from flat channels which are bent back in a U-shape. Between the facing channels, corrugated fins 11F are provided for raising the radiating efficiency.

The channels are connected to the manifold 16. The manifold 16 has a coolant inlet part 16H and a coolant outlet part 16C. The coolant inlet part 16H is connected inside of the manifold 16 to first end parts of the four radiating channels at the left side of the manifold 16, while the coolant outlet part 16C is connected inside of the manifold 16 to first end parts of the four radiating channels at the right side of the manifold 16. The other end parts of the left side and right side radiating channels which are not connected to the coolant inlet part 16H and the coolant outlet part 16C are connected inside of the manifold 16.

The coolant (warm water) which flows to the coolant inlet part 16H from not illustrated coolant piping flows into the four radiating channels at the left side of the manifold 16, makes U-turns at the end parts, returns to the manifold 16, then flows into the four radiating channels at the right side of the manifold 16. The coolant which flows into the four radiating channels at the right side of the manifold 16 makes U-turns at the end parts to again return to the manifold 16, is discharged from the coolant outlet part 16C, and flows into not illustrated coolant piping. The coolant which flows in from the coolant inlet part 16H is warm water, but the coolant which is discharged from the coolant outlet part 16C is cooled by the radiating channels of the radiator 11, so is cold water.

Figure 7A:
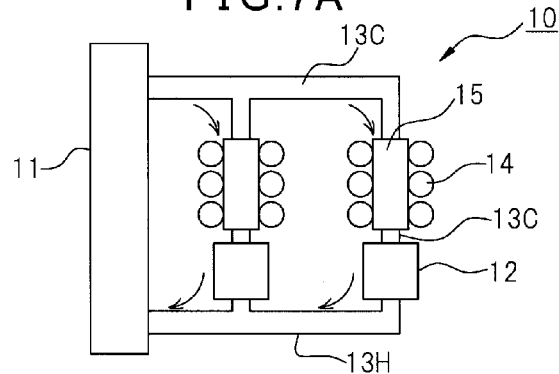
FIG. 7A is an explanatory view which explains a flow of coolant in the cooling module which is illustrated in FIG. 2A and FIG. 3A.
Figure 7B:
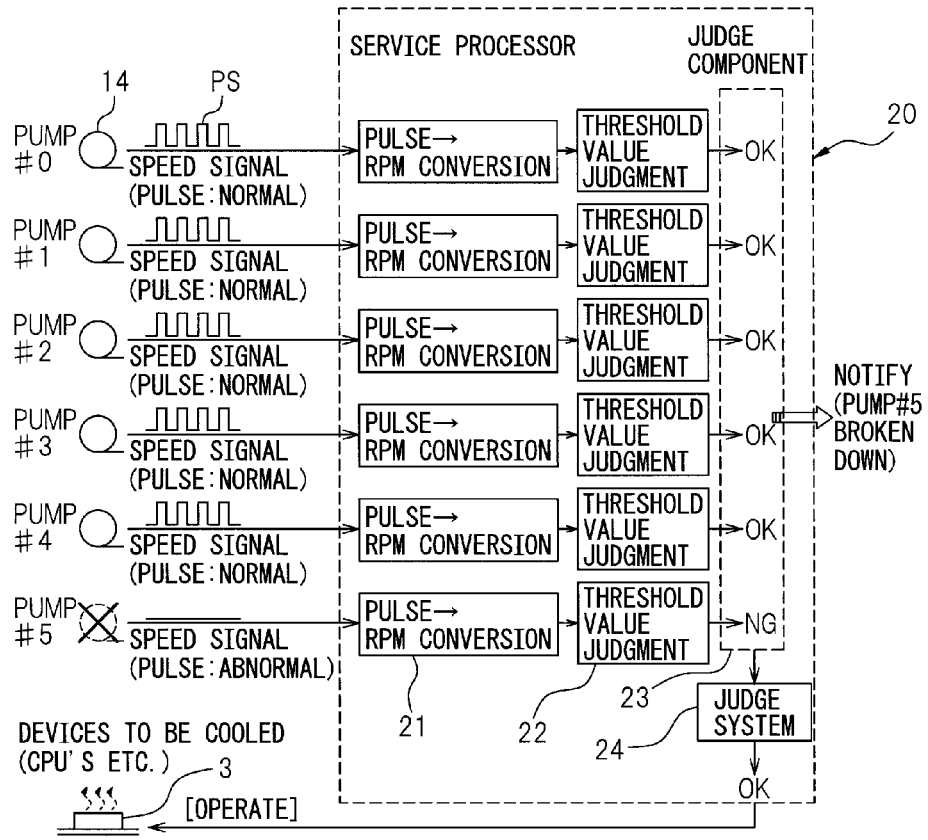
FIG. 7B is a circuit diagram which illustrates one embodiment of the configuration of a control circuit of pumps in the cooling module which is illustrated in FIG. 7A.

FIG. 7A is an explanatory view which explains the flow of coolant in the liquid cooling system 10 which is illustrated in FIG. 2A and FIG. 3A, while FIG. 7B is a circuit diagram which illustrates an embodiment of the configuration of the control circuit of the pump in the liquid cooling system 10 which is illustrated in FIG. 7A. As explained above, the coolant is cooled by the radiator 11, flows through the cold water pipe 13H into the tank 15, and is sent by the pumps 14 to the heat receiving member 12 to cool the heat generating components. The raised temperature coolant is then returned through the warm water pipe 13H to the radiator 11.

The pumps 14, while not illustrated, have speed detection sensors attached to them. The operations of the pumps 14 are monitored by a control circuit (service processor) 20 to which the speed signals (pulse signals) are input. The control circuit 20 includes conversion circuits 21 which convert pulse signals to speed signals, threshold value judgment circuits 22 which compare the speeds of the pumps 14 against a threshold value, and a component judgment circuit 23 and system judgment circuit 24 which use the outputs from the threshold value judgment circuits 22 to judge if the pumps 14 are normal.

For example, when, among the six pumps 14, just one pump 14 has broken down, the speed signal from that one pump 14 is not input to the control circuit 20, but the control circuit 20 judges that with breakdown of just one pump, the cooling of the heat generating components by the liquid cooling system 10 is not hindered. Further, the component judgment circuit 23 outputs a notification of breakdown of one of the pumps 14, but the system judgment circuit 24 outputs a command for continuation of operation (OK) of the liquid cooling system so the cooling of the heat generating components by the liquid cooling system 10 is continued. By giving redundancy to control of the pumps 14 in this way, even when a pump 14 breaks down, if the cooling ability can be secured, the liquid cooling system 10 does not stop and the CPUs can continue to be cooled, so the reliability can be secured.

Figure 8:
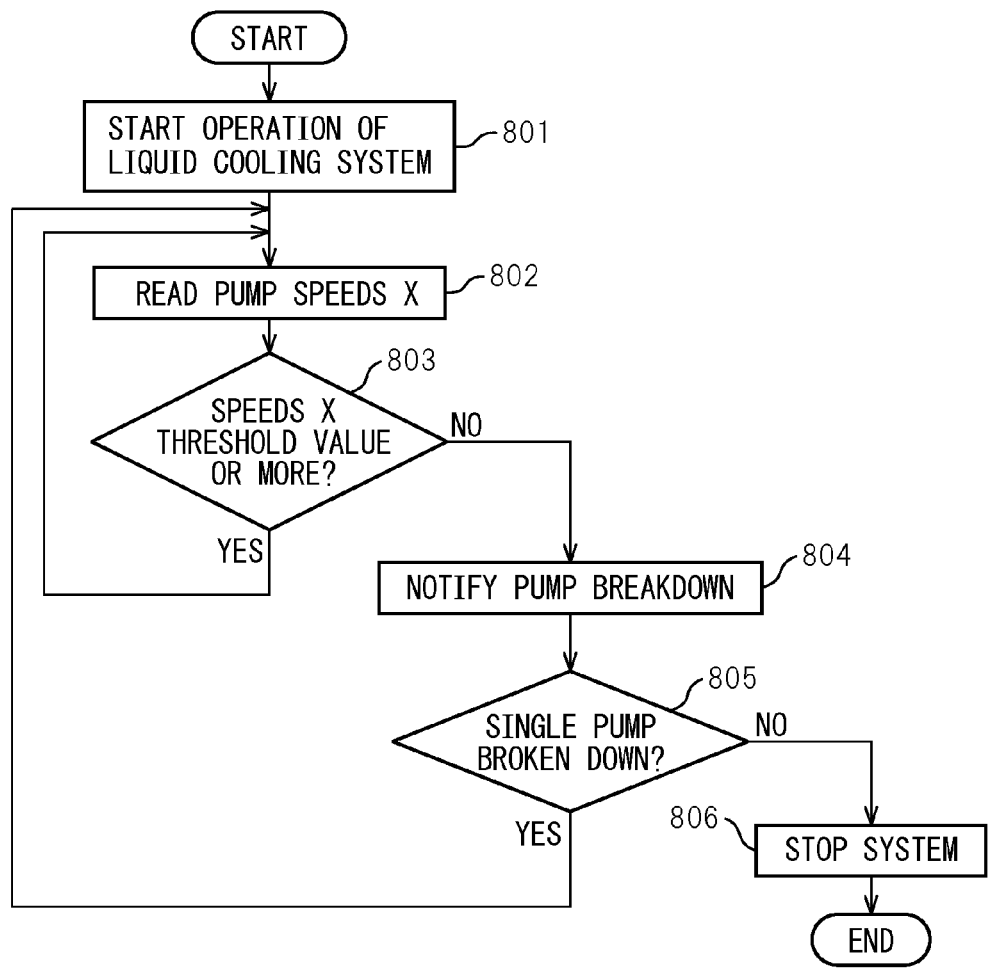
FIG. 8 is a flow chart which illustrates an embodiment of a control routine of the pumps which is illustrated in FIG. 7B.

FIG. 8 is a flow chart which illustrates one embodiment of a control routine of the control circuit 20 of the pumps 14 which is illustrated in FIG. 7B. At step 801, the operation of the liquid cooling system is started. At step 802, the control circuit 20 reads the speeds x of the pumps. While the server module is operating, the speeds of the pumps are constantly monitored by the control circuit. Further, at step 803, it is judged if the speeds x of the pumps have reached the threshold value (2050 rpm) or more. When the speeds x of all of the pumps have reached the threshold value or more (YES), the routine returns to step 802 where the speeds x of the pumps continue to be read.

On the other hand, if the judgment at step 803 is that there is a pump where the speed x has not exceeded the threshold value (NO), the routine proceeds to step 804 where breakdown of that pump is notified, then the routine proceeds to step 805. At step 805, it is judged if just one pump has broken down. If just one pump has broken down (YES), as explained above, it is judged that the cooling of the heat generating components by the liquid cooling system is not hindered and the routine returns to step 802 where the speeds x of the pumps continue to be read. In this regard, when it is judged at step 805 that several pumps have broken down (NO), it is judged that the cooling of the heat generating components by the liquid cooling system is hindered and the routine proceeds to step 806 where the operation of the cooling system is stopped and this routine is ended.

Figure 10:
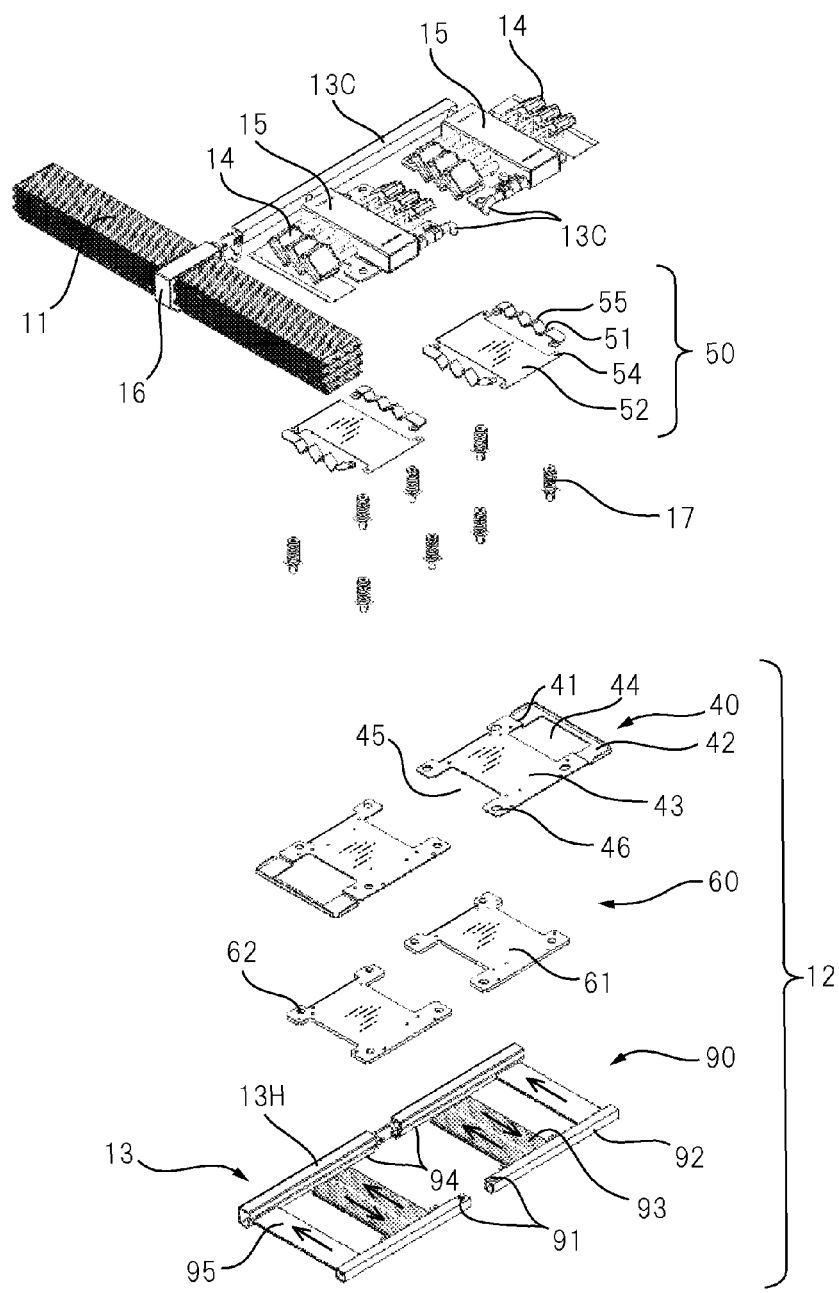
FIG. 10 is a disassembled perspective view which illustrates specific component members of a cooling module according to the present application.
Figure 12:
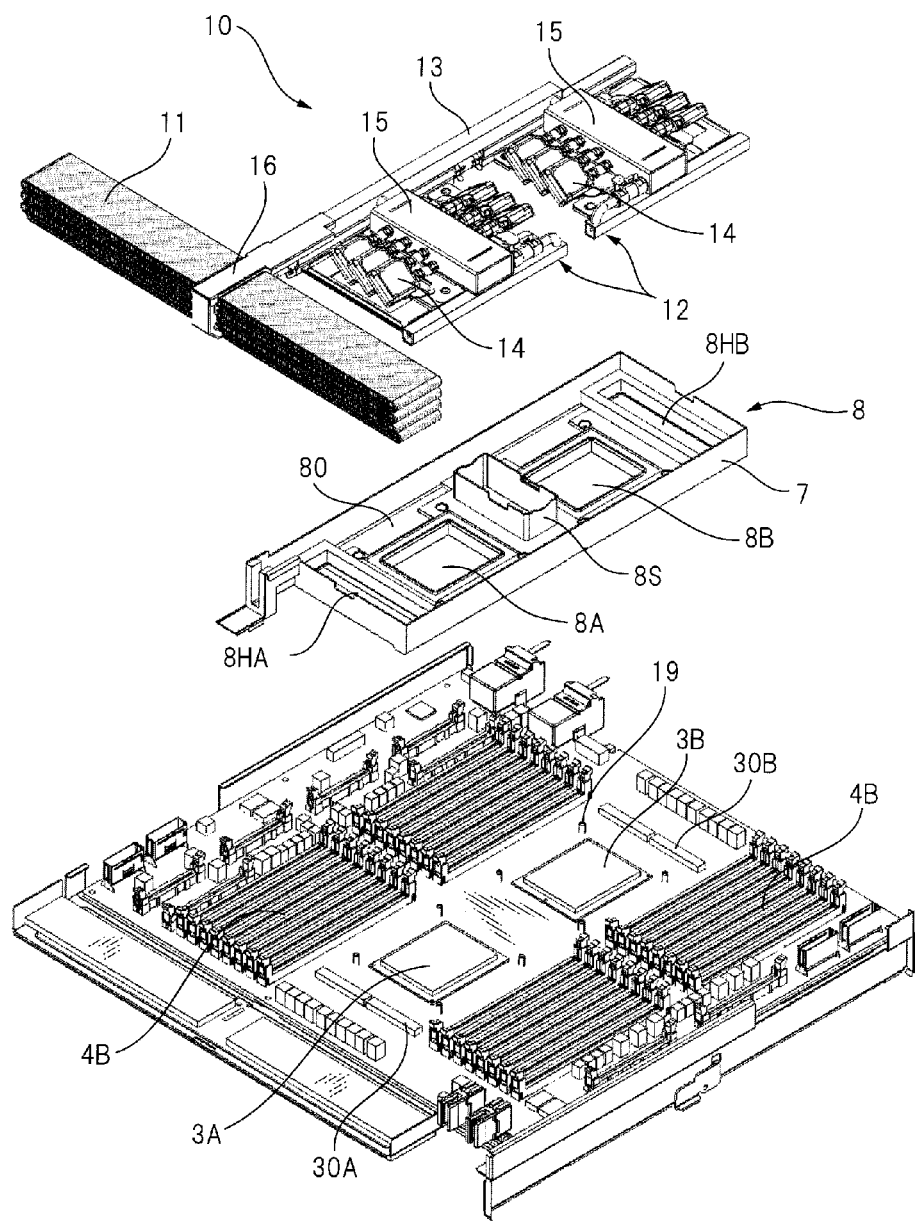
FIG. 12 is an assembled perspective view which illustrates an embodiment which arranges a leakage tray between a cooling module and a main board which are illustrated in FIG. 3A.

FIG. 10 is a disassembled perspective view which illustrates in detail the configuration of members under the pumps 15 and the tanks 15 in the liquid cooling system 10 according to the present application. Under the pumps 14 and the tanks 15, there are pump support mechanisms 50 and heat receiving members 12. The heat receiving members 12 are fastened by heat receiving member fastening parts 17 to the top of a not illustrated main board. At the inside of the heat receiving member fastening parts 17, female threads are formed. These engage with male screws 19 which are illustrated in FIG. 12. The pump support mechanisms 50 are provided with pump placers 51, base plates 52, mounts 54, and brackets (pump mounting fittings) 55. Further, each heat receiving member 12 is provided with a metal plate 40, CPU-use metal plate 60, and cold plate 90.

The metal plate 40 has a step part 41, a CPU power source-use metal plate part 42, a CPU-use metal plate part 43, a hole 44 for avoiding interference with the mounted components, a recessed part 45, and holes 46 for insertion of the heat receiving member fastening parts 17. The CPU-use metal plate 60 has a base plate 61 and mounting holes 62 for insertion of the heat receiving member fastening parts 17. The cold plate 90 has a cold water inlet 91, coolant channel 92, CPU-use cold plate 93, U-turn channel 94, and CPU power source-use cold plate 95. The members which form the metal plate 40, CPU-use metal plate 60, and the cold plate 90 will be explained in detail later using enlarged drawings.

Figure 11A:
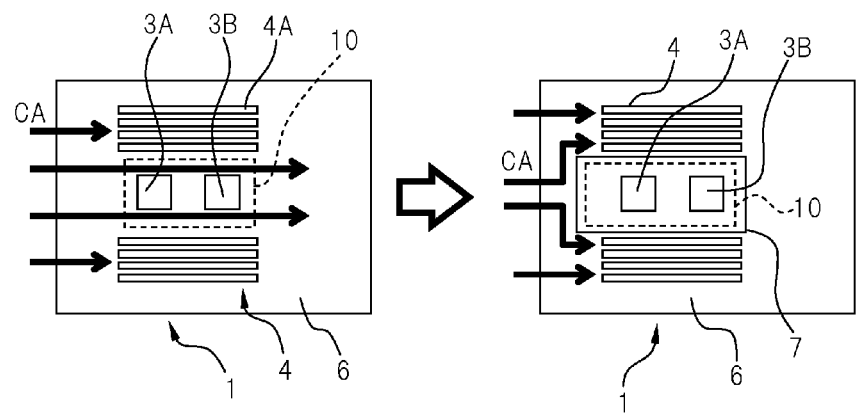
FIG. 11A is a comparative view which compares the flow of the cooling air which flows through the inside of a server module which is provided with an air cooling system and the flow of the cooling air in the case of providing a wall at a center part inside of the server module.

Here, the air barrier wall and the leakage tray which are provided at the server module of the present application will be explained. FIG. 11A is a comparative view which compares the flow of cooling air CA which flows through the inside of the server module 1 which is provided with the air cooling system and the flow of cooling air CA in the case of setting an air barrier wall 7 at the center part of the inside of the server module 1. When the server module 1 does not have the air barrier wall 7 inside it, the cooling air CA which is generated by the fans mainly flows over the main board 6 at which the low height heat generating components 3 (CPUs 3A and 3B) are mounted since the parts where the electronic components 4 are concentrated have channel resistance.

Channel resistance is generated due to the narrow interval between components on the main board 6 due to high density mounting and the high height of the components which are mounted at such regions. That is, the electronic components 4 are DIMMs, power modules, and other components which are formed by circuits on sub boards which are mounted vertically on the main board 6, so are high in height. Therefore, the channels of the cooling air CA end up being blocked by the DIMMs, power modules, etc., so channel resistance occurs. As opposed to this, the CPUs 3A and 3B are directly mounted on the main board 6, so are lower in height compared with DIMMs, power modules, etc. DIMMs have a height from the board 6 of, for example, 33 mm. Further, the leakage tray 8 has a height from the board 6 of, for example, 26.5 mm. The lower limit value of the height of the leakage tray 8 for preventing leakage is about half of that or 13 mm, while the upper limit value of the height of the leakage tray 8 for preventing contact with the ceiling of the housing is 35 mm. If in this range of height, there will be no leakage and higher efficiency of cooling of the DIMMs and power source can be expected.

Even if the main board 6 on which low height heat generating components 3 are mounted is provided which an abovementioned such liquid cooling system 10 as illustrated by the broken lines, the cooling air CA flows to around the liquid cooling system, so the cooling ability of the electronic components 4 by the cooling air CA falls. That is, in the region inside the broken lines, only components which require strong cooling which are covered by liquid cooling and components which require weak cooling which have a low heat generating characteristic (including no heat generation) of an extent not requiring air cooling are mounted. Despite the fact that the supply of cooling air is not required, the cooling air flows into this region. Therefore, the cooling air which is supplied to the electronic components 4 which relatively require the supply of cooling air is reduced, so the cooling performance of the electronic components 4 falls.

Therefore, to prevent the cooling air CA from flowing to around the heat generating components 3, the area around the liquid cooling system 10 which is mounted over the heat generating components 3 is covered by an air barrier wall 7. Therefore, the cooling air CA is prevented from flowing to the components which require strong cooling 3. As a result, the inflow of cooling air to the region which does not require the supply of cooling air can be prevented and all of the cooling air can be supplied to the components which require weak cooling 4 where the cooling air is required, so the cooling ability of the electronic components 4 by the cooling air CA is improved.

Figure 11B:
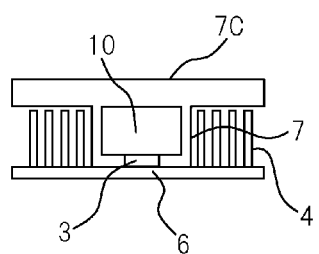
FIG. 11B is a cross-sectional view which illustrates an embodiment where the wall is covered by a ceiling part.
Figure 11C:
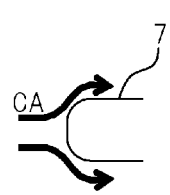
FIG. 11C is an explanatory view which illustrates the flow of the cooling air in the case of providing a curved part at an upstream side of the wall.
Figure 11D:
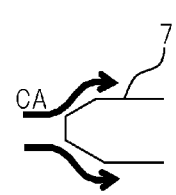
FIG. 11D is an explanatory view which illustrates the flow of the cooling air in the case of providing a tapered part at an upstream side of the wall.

Furthermore, as illustrated in FIG. 11B, if forming a ceiling part 70 above the air barrier wall 7 which is provided around the heat generating components 3 and the liquid cooling system 10 which are mounted on the main board 6 and covering the heat generating components 3 and the liquid cooling system 10 as a whole by these, the cooling ability of the electronic components 4 by the cooling air CA is improved much more. Further, when providing the air barrier wall 7 around the heat generating component 3 and the liquid cooling system 10, as illustrated in FIG. 11C, if providing a curved part at the upstream side of the air barrier wall 7 or, as illustrated in FIG. 11D, if providing a tapered part at the upstream side of the air barrier wall 7, the cooling air CA more easily flows to the electronic component sides.

In this regard, in the liquid cooling system 10 which has been explained up to here, the coolant for performing the cooling is a liquid (for example, water), so there is a possibility of coolant leaking from the coolant piping 13 or connecting parts of the coolant piping 13 and the heat receiving members 12, pumps 14, or tanks 15. Further, if coolant leaks from the liquid cooling system 10, the leaked coolant is liable to overflow on to the main board 6 whereby the electronic components 4 are liable to be flooded and the circuits to short. Therefore, it is considered to place a leakage tray which prevents leakage of leaked coolant to other locations below the heat receiving members, pumps 14, and tanks 15 of the liquid cooling system 10.

Figure 13A:
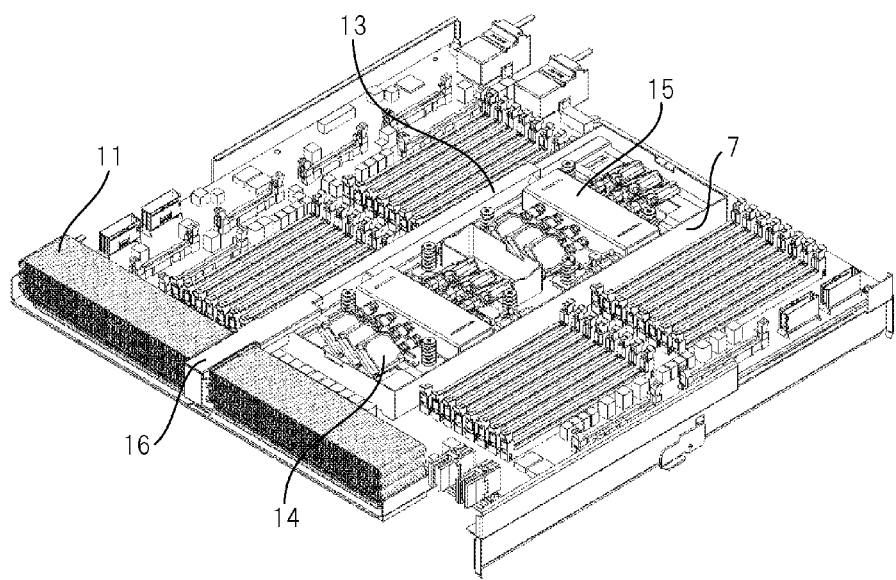
FIG. 13A is a perspective view which illustrates the state of mounting a leakage tray and a water cooling system on the main board which is illustrated in FIG. 12.

FIG. 12 is an assembled perspective view which illustrates the state of insertion of the leakage tray 8 between the main board 6 which is illustrated in FIG. 3A and the liquid cooling system 10 which is mounted on the main board 6, while FIG. 13A is a perspective view which illustrates the state of mounting the leakage tray 8 and the liquid cooling system 10 on the main board 6. On the main board 6, assume that the CPUs 3A and 3B, sockets 4B for attaching sub boards, and power circuits 30A and 30B for CPU use are mounted. Further, the liquid cooling system 10, as explained above, includes a radiator 11, heat receiving members 12, coolant piping 13, pumps 14, tanks 15, and the manifold 16.

The leakage tray 8 is provided with a base plate 80, CPU contact-use holes 8A and 8B, power circuit contact-use holes 8HA and 8HB, and the air barrier wall 7 which sticks out from the periphery of the base plate 80. The CPU contact-use holes 8A and 8B are holes for insertion of the CPUs 3A and 3B on the main board 6, while the power circuit contact-use holes 8HA and 8HB are holes for insertion of CPU-use power circuits 30A and 30B. Further, the base plate 80 between the CPU contact-use holes 8A and 8B is provided with a sleeve 8S. The sleeve 8S will be explained later.

The air barrier wall 7 is formed by extending and bending upward the outer edge part of the base plate 80 of the leakage tray 8. This is because the outer edge part of the base plate 80 of the leakage tray 8 requires a bent part for keeping leakage from the liquid cooling system 10 inside the leakage tray 8, so this bent part is extended upward to increase the wall height and serve also as an air barrier wall 7. If attaching the leakage tray 8 on the main board 6 and attaching the liquid cooling system 10 over that, as illustrated in FIG. 13A, the air barrier wall 7 sticks out around the pumps 14 and the tanks 15 and therefore the cooling air no longer enters the region where the pumps 14 and the tanks 15 are provided.

Figure 13B:
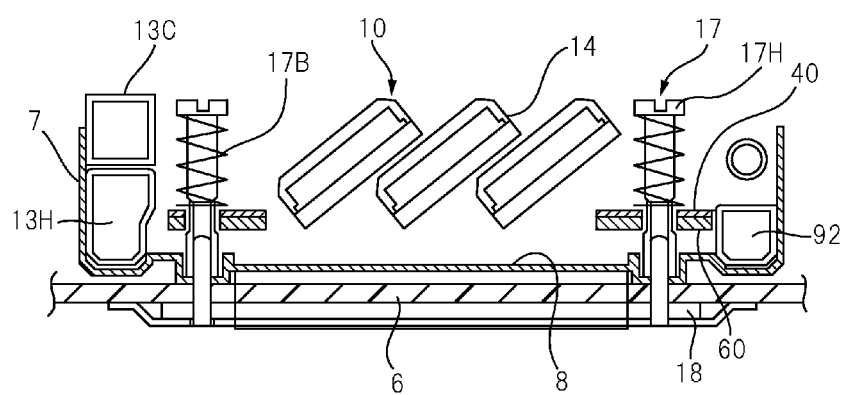
FIG. 13B is a cross-sectional view of principal parts of the server module which is illustrated in FIG. 13A.

FIG. 13B is a cross-sectional view of the liquid cooling system 10 which is illustrated in FIG. 13A in the direction vertical to the flow of the cooling air. The heat receiving member fastening parts 17 are screw components with springs 17B wound around their top parts. They are inserted from the metal plate 40 side through the metal plates 40, CPU-use metal plates 60, leakage tray 8, and main board 6 and screwed into the fastening plate 18 which is attached to the rear side of the main board 6. The springs 17B are inserted between the heads 17H of the heat receiving member fastening parts 17 and the metal plates 40 and bias the metal plates 40 to the main board 6 side. From this figure, it will be understood that the air barrier wall 7 holds inside it all of the components in the range from the cold water pipe 13C and warm water pipe 13H to the coolant channel 92 of the cold plate and that the cooling air will not enter inside the liquid cooling system 10.

Figure 14A:
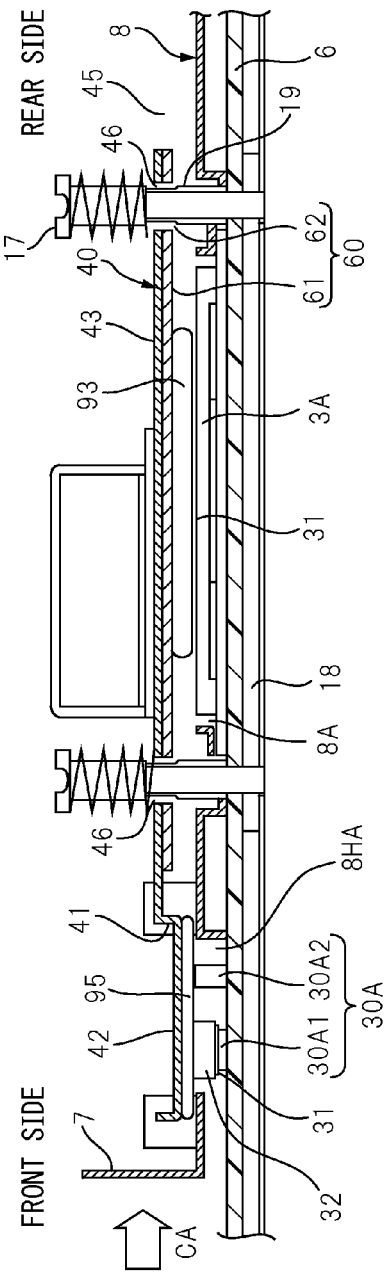
FIG. 14A is a cross-sectional view of principal parts of the server module which is illustrated in FIG. 13.

On the other hand, FIG. 14A is a partial cross-sectional view of the liquid cooling system 10 which is illustrated in FIG. 13A in the direction along the flow of the cooling air. FIG. 14A illustrates only the part of the CPU 3A. The cross-section of the CPU 3B side is omitted. From this figure as well, it will be understood that the heat receiving member fastening parts 17 are screwed by the male screws 19 with the fastening plate 18 at the rear side of the main board 6 and that the springs 17B bias the metal plate 40 from the head 17H side to the main board 6 side.

Here, the engaged state of the metal plate 40, CPU-use metal plate 60, and the cold plate 90 which are illustrated in FIG. 10 and the main board 6 and leakage tray 8 which are illustrated in FIG. 12 will be explained using FIG. 14A. The main board 6 mounts as the CPU-use power circuit 30A a first component 30A1 and a second component 30A2 and a CPU 3A. In the state of the main board 6 having the leakage tray 8 attached, the CPU-use power circuit 30A enters the power contact-use hole 8HA of the leakage tray 8, while the CPU 3A enters the CPU contact-use hole 8A of the leakage tray 8. At the surface of the base 80 of the leakage tray 8 on the main board 6 side, the CPU contact-use holes 8A and 8B may be surrounded by packing. The packing is adhered around the CPUs 3A and 3B whereby the water-stemming effect is enhanced.

The cold plate 90 which is illustrated in FIG. 10 includes the CPU-use cold plate 93 and the CPU power source-use cold plate 95. The CPU-use cold plate 93 has two channels. The end of one channel is connected to the cold water inlet 91, while the other end is connected to the U-turn channel 94. The other channel has one end connected to the U-turn channel 94, while has the other end connected to the coolant channel 92. The coolant channel 92 is divided inside it into two channels. The coolant channel 92 with the cold water inlet 91 and the coolant channel 92 through which coolant which has passed the U-turn channel 94 returns are not communicated. Therefore, the entire amount of the coolant which has passed through the U-turn channel 94 and returned to the coolant channel 92 flows into the CPU power source-use cold plate 95 and flows into the warm water pipe 13H of the coolant piping 13. The flow of the coolant is illustrated by the arrow marks in FIG. 10.

If the liquid cooling system 10 is attached over the leakage tray 8, the CPU-use cold plate 93 of the cold plate 90 which forms the heat receiving member 12 is positioned right above the CPU 3A, while the CPU power source-use cold plate 95 is positioned right above the CPU-use power circuit 30A. At this time, the CPU 3A is laid over the CPU-use cold plate 93 through a heat conducting sheet 31, but the first component 30A1 of the CPU-use power circuit 30A is low in height, so is not laid over the CPU power source-use cold plate 95. Therefore, the first component 30A1 of the CPU-use power circuit 30A has provided on it a metal rod 32 for contact with the CPU power source-use cold plate 95 through the heat conducting sheet 31.

The CPU metal plate 60 is provided with mounting holes 62 at the four corners of the base plate 61. The heat receiving member fastening parts 17 which are inserted through the mounting holes 62 are used to lay the base plate 61 over the CPU-use cold plate 93.

The metal plate 40 is provided with a CPU-use metal plate part 43. This CPU-use metal plate part 43 is provided with holes 46 which overlap the mounting holes 62 which are formed at the four corners of the base plate 61. One end part of the metal plate 40 has a step part 41. This step part 41 is provided with springiness. Further, the CPU power source-use metal plate part 42 which follows the step part 41 is much lower than the CPU-use metal plate part 43 and is formed to approach the main board 6 at the time of mounting. In the state where the metal plate 40 is attached by the heat receiving member fastening parts 17, the CPU-use metal plate part 43 is laid over the base plate 61 of the CPU metal plate 60 and the CPU power source-use metal plate part 42 is laid over the CPU power source-use cold plate 95. Further, in the state where the CPU-use metal plate part 43 of the metal plate 40 is laid over the base plate 61 of the CPU metal plate 60, the height of the bottom surface of the CPU power source-use metal plate part 42 from the main board 6 is lower than the height of the top surface of the CPU power source-use cold plate 95 from the main board 6. For this reason, in the state where the metal plate 40 is attached by the heat receiving member fastening parts 17 and the CPU power source-use metal plate part 42 is laid over the CPU power source-use cold plate 95, the springiness of the step part 41 causes the CPU power source-use cold plate 95 to be biased by the CPU power source-use metal plate part 42.

Due to the above such configuration, the heat which is generated by the CPUs 3A and 3B and components in the CPU-use power source component 30A which are arranged in the first region A1 of the main board 6 is absorbed by the CPU-use cold plate 93 and the CPU power source-use cold plate 95.

Figure 14B:
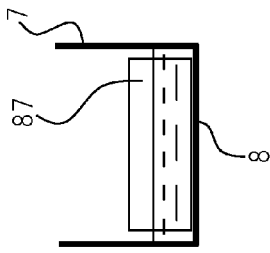
FIG. 14B is a schematic cross-sectional view which illustrates the structure of the leakage tray which illustrates a second embodiment of the leakage tray which is illustrated in FIG. 14A.
Figure 14C:
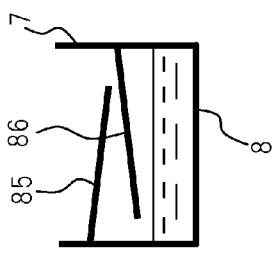
FIG. 14C is a schematic cross-sectional view which illustrates the structure of the leakage tray which illustrates a third embodiment of the leakage tray which is illustrated in FIG. 14A.
Figure 14D:
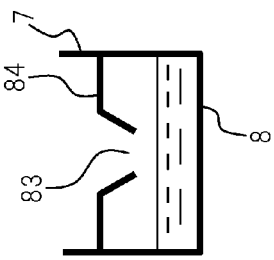
FIG. 14D is a schematic cross-sectional view which illustrates the structure of the leakage tray which illustrates a fourth embodiment of the leaking water prevention structure of the cooling module which is illustrated in FIG. 14A.

Note that, if making the bottom plate of the leakage tray 8 for preventing leakage from the liquid cooling system 10, as illustrated in FIG. 14B and FIG. 14C, a double layer structure, it becomes harder for the coolant which has leaked from the liquid cooling system 10 to escape. FIG. 14B illustrates an embodiment wherein a drain 83 is provided at a double layer bottom 84. FIG. 14C illustrates the configuration of an embodiment which is provided with two slanted bottom plates 85, 86. Further, it is possible to not make the leakage tray 8 a double layer bottom but, as in another embodiment which is illustrated in FIG. 14D, insert a water absorbing sheet 87 at the bottom plate of the leakage tray 8 so as to make it difficult for the coolant which has leaked from the liquid cooling system 10 to escape.

Figure 15A:
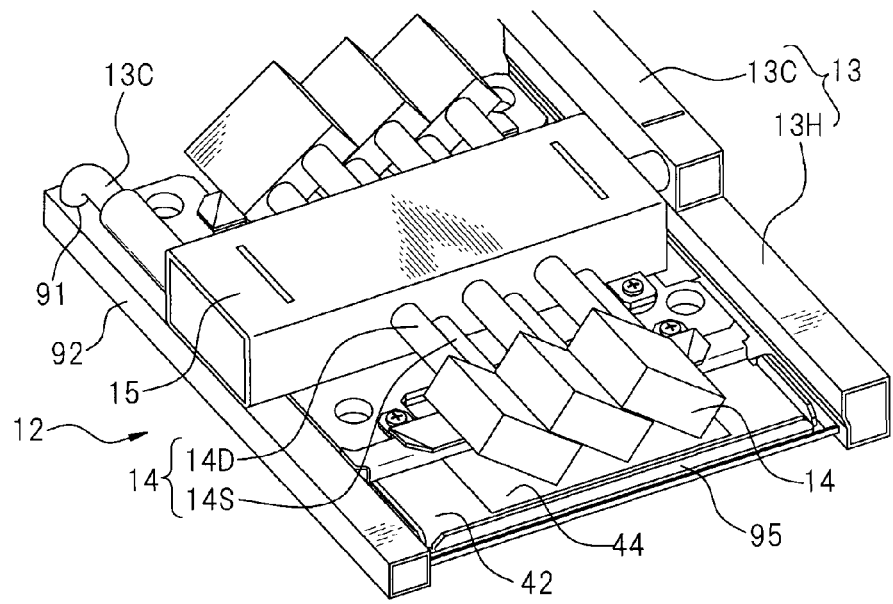
FIG. 15A is a partially enlarged perspective view which illustrates the configuration of six pumps and heat receiving members which are arranged at the two sides of the tank of the cooling module.

FIG. 15A is a partially enlarged perspective view which illustrates the mounting state of the six pumps 14 which are arranged at the two sides of a tank 15 of the liquid cooling system 10. As explained above, the tank 15 has six pumps 14 connected to it. The tank 15 is supplied with coolant from the cold water pipe 13C of the coolant piping 13. Between the pumps 14 and the tank 15, suction pipes 14S and discharge pipes 14D are connected. The coolant inside the tank 15 is sucked out by the pumps 14, pressurized, and returned to the tank 15. The coolant which is pressurized by the pump 14 runs from the end of the tank 15 at the opposite side to the feed side through the cold water pipe 13C and is supplied to the heat receiving members 12. The structure of the heat receiving members 12 has already been explained, so the same component members will be assigned the same reference signs and explanations omitted. The heat absorbing coolant is returned from the CPU power source-use cold plate 95 of the heat receiving members 12 to the warm water pipe 13H.

Figure 15B:
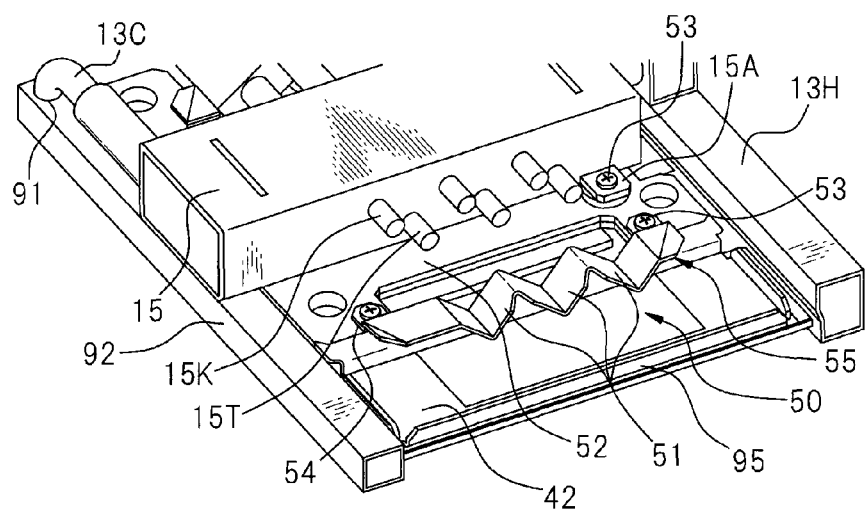
FIG. 15B is a partially enlarged perspective view which illustrates a holding structure which holds at a slant the six pumps which are illustrated in FIG. 15A.

FIG. 15B is a partially enlarged perspective view which removes the six pumps 14 from the structure which was illustrated in FIG. 15A so as to explain the structure of the pump support mechanism 50. A tank 15 is fastened to the base plate 52 of the pump support mechanism by screws 53 at the mounting tabs 15A which are provided at the coolant piping 13 side. Further, the base plate 52 has mounts 54 which are present at the two end parts of brackets 55 which are provided with three pump placers 51 fastened to it by screws 53. To place the pumps 14 at a slant from the tank 15, the pump placers 51 are made V-grooves. At the side surfaces of the tank 15, discharge ports 15T for discharging coolant to the pumps 14 and suction ports 15K for the inflow of coolant from the pumps are provided. The brackets 50 are, for example, comprised of SUS (stainless steel sheet). Further, the pump placers 51 are provided with buffer plates between the brackets 55 and the pumps 14. These buffer plates enable any offset which occurs due to deformation of the heat receiving members 12 and the tank 15 or dimensional tolerance at the time of manufacture to be absorbed.

Figure 16:
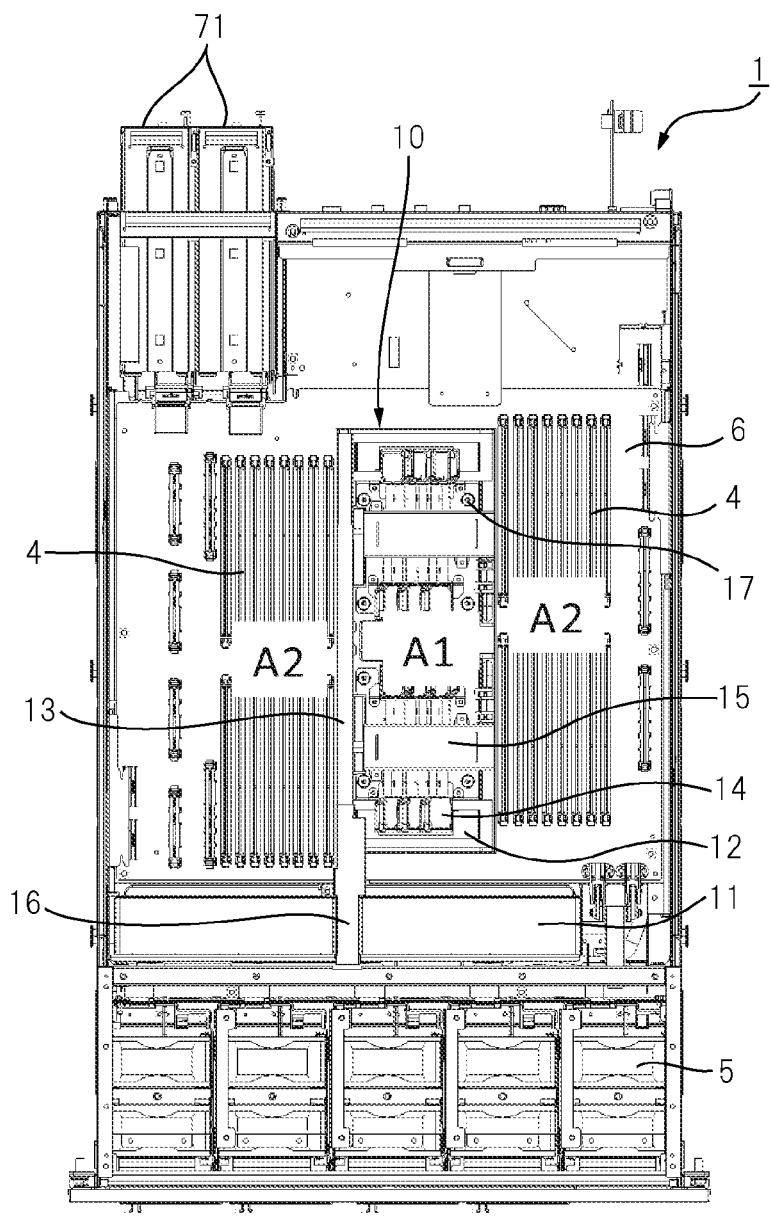
FIG. 16 is a plan view which illustrates a second embodiment of a server module 1 which mounts an air cooling system and the cooling module of the present application.

FIG. 16 is a plan view which illustrates a second embodiment of the server module 1 in which an air cooling system and the liquid cooling system 10 of the present application are mounted. The server module 1 of the second embodiment differs from the above-mentioned embodiment in the point that at the rear surface side of the server module 1, a connection unit (hereinafter referred to as an "XB unit") 71 is provided which connects the main boards 6 at the server module 1 which are stacked in the vertical direction. The XB unit 71 is provided at the second region A2 at one side of the first region A1 which is provided with the liquid cooling system 10 and at the downstream side in the flow of the cooling air. The configuration of the liquid cooling system 10 at the first region A1 and the configurations of the second regions A2 which are arranged at the two sides of the first region A1 are similar to the already explained embodiments, so the same component members will be assigned the same reference signs and their explanations will be omitted.

Figure 17:
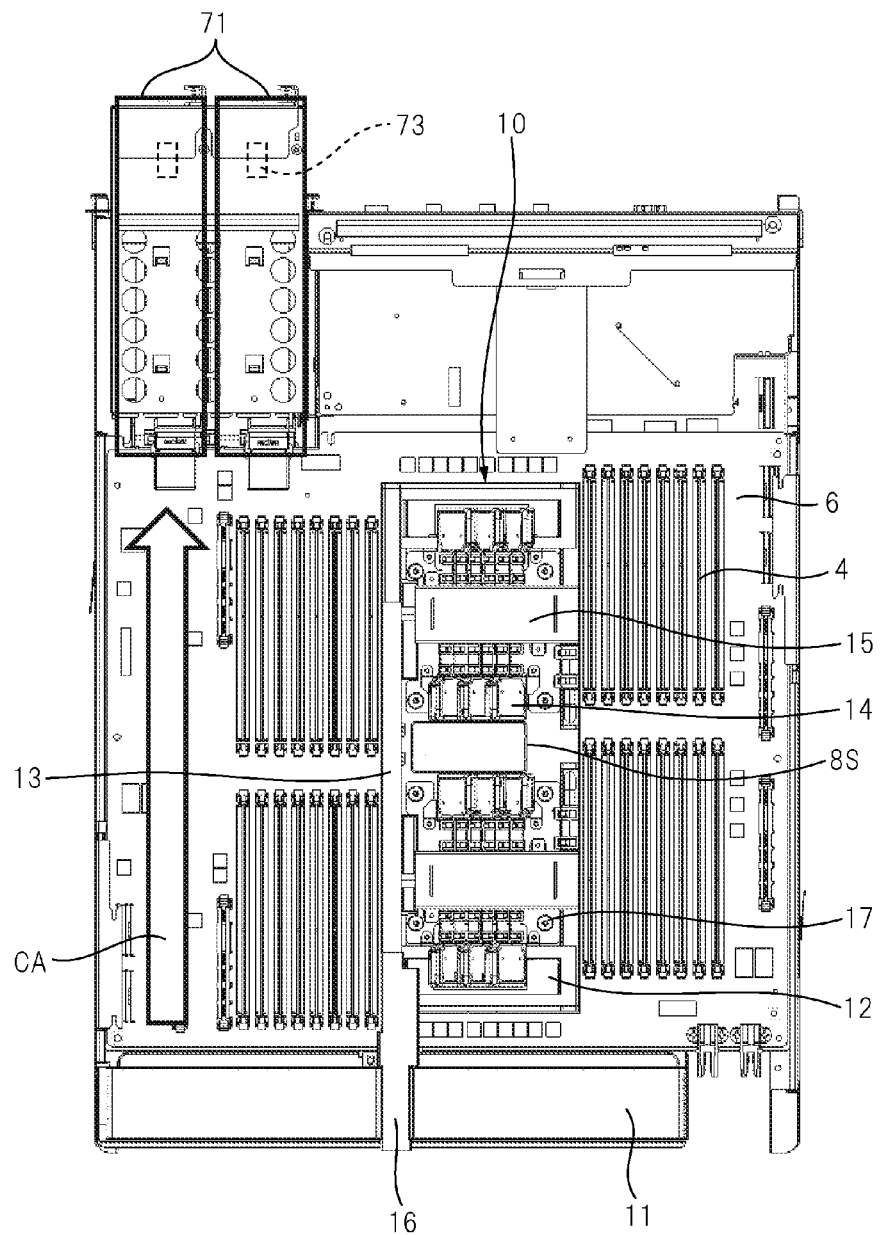
FIG. 17 is a plan view which illustrates the state of cooling air of the air cooling system being supplied to a connection mechanism of top and bottom server modules which are provided at the rear surface side of the server module of the second embodiment which is illustrated in FIG. 16.

Like in the second embodiment of the server module 1, when the server module 1 is provided with the XB unit 71, at the inside of the XB unit 71, as illustrated in FIG. 17, there is an XB chip 73 which generates a large amount of heat at the time of operation. Further, this XB chip 73 is a weak cooling component which requires cooling by cooling air. For this reason, in the second embodiment of the server module 1, the first region A1 and the two second regions A2 are shifted to one side with respect to the housing of the server module 1. Cooling air CA is sent through the part opened by the shift to the XB unit 71.

Figure 18:
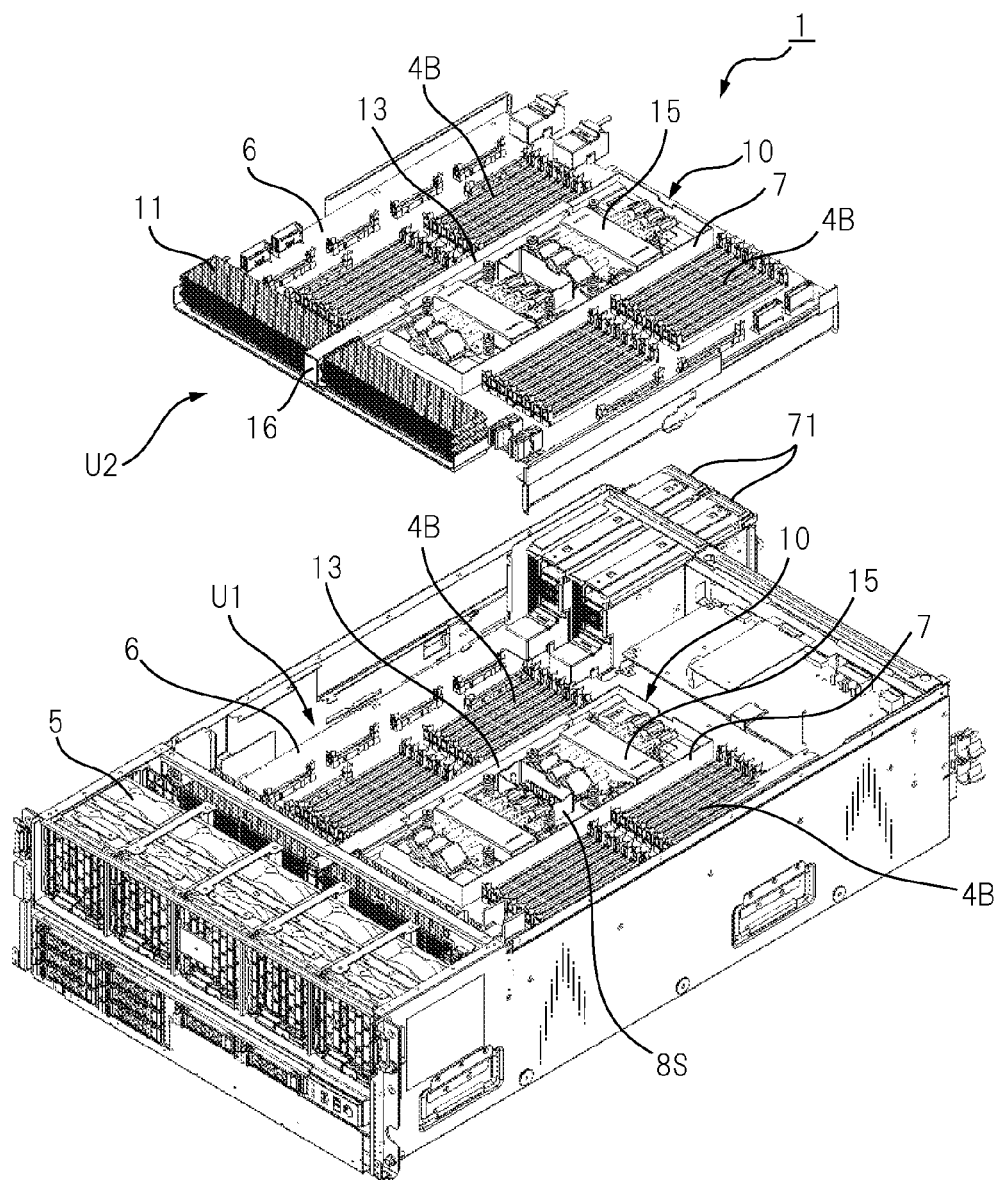
FIG. 18 is an assembled perspective view which illustrates a third embodiment of the present application where a single server module mounts two main boards on which cooling modules are mounted.

FIG. 18 is an assembled perspective view which illustrates a third embodiment of the server module 1 of the present application which provides the server module 1 of the second embodiment which was explained in FIG. 16, FIG. 17 with the liquid cooling system 10 and which attaches two main boards 6. Here, the main board 6 which is provided with the first and the second regions A1, A2, which mounts on those regions the already explained heat generating components or electronic components, and is provided with the liquid cooling system 10 will be called a "system unit". This being the case, in the server module 1 of the third embodiment, the first system unit U1 is first attached on the housing, then the second system unit U2 is attached laid over the top side of the first system unit U1. The positions of the electronic components at the main board 6 of the first system unit U1 and the positions of the electronic component at the main board 6 of the second system unit U2 are exactly the same.

Figure 19:
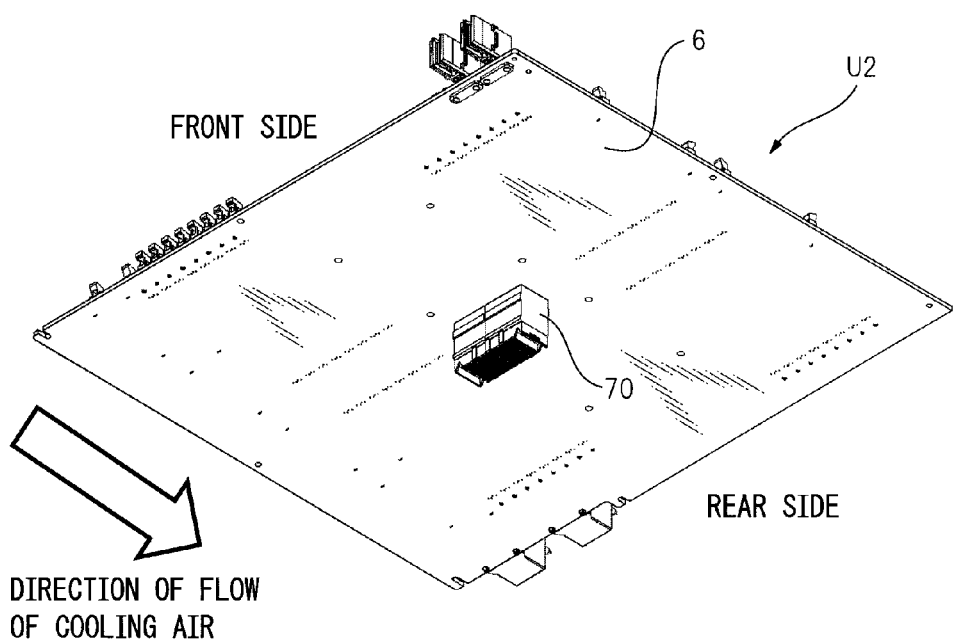
FIG. 19 is a perspective view which illustrates the structure of a bottom surface of a top side main board which is illustrated in FIG. 18.

In this case, the bottom surface of the main board 6 of the second system unit U2 has a connector 70 which is illustrated in FIG. 19 attached to it. The connector 70 is for connecting a circuit at the second system unit U2 to the circuit at the first system unit U1 when the second system unit U2 is attached laid over the top side of first system unit U2. If the first system unit U1 and the second system unit U2 are electrically connected through the connector 70, the CPUs 3A, 3B which are at one main board 6 can use the data of the DIMMs 4 at the other main board 6.

The position of the connector 70 which is provided at the bottom surface of the second system unit U2 is the same as the position of the sleeve 8S at the leakage tray 9 which is attached to the main board 6 of the first system unit U1. In this case, the main board 6 of the first system unit U1 mounts a connector (pair connector) which mates with the connector 70 which is provided at the bottom surface of the main board 6 of the second system unit U2 inside the sleeve 8S of the leakage tray 8. Therefore, if the second system unit U2 is attached laid over the top side of the first system unit U1, the connector 70 which is at the second system unit U2 is inserted into the sleeve 8S at the first system unit U1 and connected to the pair connector.

Figure 20:
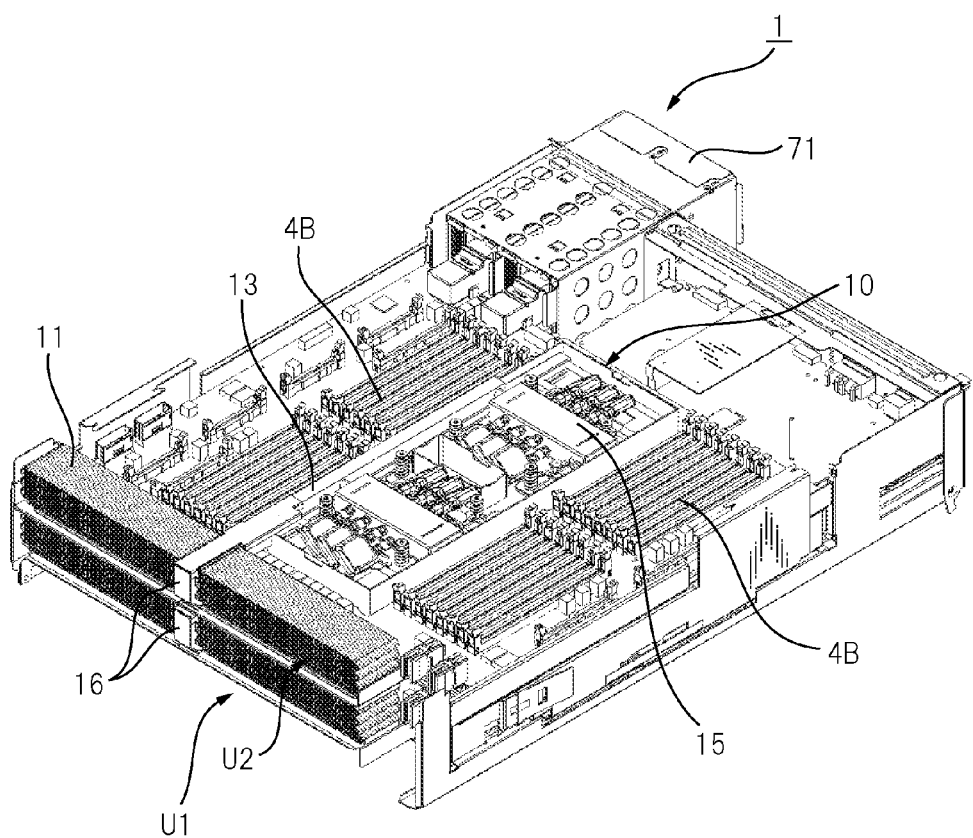
FIG. 20 is a perspective view of principal parts of the server module in the state where a first system unit which is illustrated in FIG. 18 has a second system unit laid over it.

FIG. 20 is a perspective view of principal parts of the server module 1 which illustrates the state with the first and the second system units U1, U2 which are illustrated in FIG. 18 stacked together. Illustration of the fans will be omitted. As will be understood from this figure, even in the state with the second system unit U2 attached over the top side of the first system unit U1, a path for cooling air to the XB unit 71 is secured. Note that, as illustrated in FIG. 18, the size of the fans 5 is a size which enables sufficient cooling air to be sent to radiators 11 which are stacked in two levels.

In this way, according to the present application, it is possible to provide a liquid cooling system which has the ability to radiate off a high amount of generated heat, which can be mounted at a high density at a predetermined device while saving space, and, furthermore, which enables a mountable area of components other than those for cooling to be broadly secured. Further, it is possible to provide a liquid cooling system which has pumps for transport of coolant redundantly configured and redundantly controlled and thereby secures a high reliability and does not obstruct cooling of other components besides the ones being cooled and to provide an electronic apparatus which mounts the same.

The liquid cooling system of the present application enables cooling of two 300 W CPUs by a pump flow rate of 0.9 liter/min in the case of a radiator of a size of a height of 36 mm, a depth of 59 mm, and a width of 350 mm. Further, the path of the cooling air which cools the DIMMs only has a radiator in it, so the cooling air efficiently hits the DIMMs and therefore 256 W of DIMMs (32 8W DIMMs) becomes possible. Further, if assuming notification of abnormalities in the pumps and replacements being installed in a short time from the occurrence of the abnormalities, the possibility of two pumps simultaneously breaking down is eliminated and the possibility of system trouble occurring in the liquid cooling system can be eliminated.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. An electronic apparatus comprising:
a fan;
a circuit board which is positioned downstream in an airflow which the fan generates;
at least one processor mounted on the circuit board;
a radiator which is positioned downstream in the airflow which the fan generates, the radiator cooling a liquid coolant;
a pipe unit which includes a heat receiving member in which the coolant flows and coolant piping, the heat receiving member being mounted on the processor, and the coolant piping circulating the liquid coolant between the radiator and the heat receiving member; and
at least one memory board on which memory package is mounted, the memory board being mounted on the circuit board, and the memory board and the pipe unit being arranged along a direction perpendicular to a direction in which the fan blows the airflow,
wherein the coolant piping is connected by a manifold to the radiator, and
wherein the radiator comprises at least one radiating channel at a left side of the manifold and at least one radiating channel at a right side of the manifold.

2. The electronic apparatus according to claim 1, wherein a plurality of the memory boards are arranged at both sides of the processor in the direction perpendicular to the direction to which the fan blows the airflow, and wherein data stored in the memory package is accessible by the processer.

3. The electronic apparatus according to claim 2 wherein the memory boards are mounted vertically on the circuit board and extend along the direction in which the fan blows the airflow.

4. The electronic apparatus according to claim 1, wherein a plurality of the processors are arranged along the direction to which the fan blows the airflow.

5. The electronic apparatus according to claim 1, wherein the cooling piping has first piping which extends along the direction to which the fan blows the airflow and supplies the coolant to the heat receiving member, and second piping which extends along the direction in which the fan blows the airflow and supplies the coolant to the radiator.

6. The electronic apparatus according to claim 1, wherein a plurality of the fans are arranged along a direction vertical to the direction to which the fans blow the airflow and the direction of the airflow is along a surface of the circuit board.

7. The electronic apparatus according to claim 1, further comprising a pump mounted on the heat receiving member and configured to circulate the liquid coolant.

8. The electronic apparatus according to claim 1, wherein the at least one memory board is positioned downstream of the radiator in the airflow.

9. The electronic apparatus according to claim 1, wherein the at least one memory board and the processor are arranged along a direction perpendicular to a direction to which the fan blows the airflow.

10. The electronic apparatus according to claim 1,
wherein a plurality of memory boards are arranged at both sides of the processor in the direction perpendicular to the direction of the airflow,
wherein the radiating channel at the left side of the manifold is positioned between the fan and the memory board arranged at one side of the processor in the direction perpendicular to the direction of the airflow,
wherein the radiating channel at the right side of the manifold is positioned between the fan and the memory board arranged at the other side of the processor in the direction perpendicular to the direction of the airflow.

\* \* \* \* \*